US009589951B2

(12) United States Patent
Nagumo et al.

(10) Patent No.: US 9,589,951 B2
(45) Date of Patent: Mar. 7, 2017

(54) HIGH-ELECTRON-MOBILITY TRANSISTOR WITH PROTECTIVE DIODE

(71) Applicant: Renesas Electronics Corporation, Koutou-ku, Tokyo (JP)

(72) Inventors: Toshiharu Nagumo, Tokyo (JP); Takashi Hase, Tokyo (JP); Kiyoshi Takeuchi, Tokyo (JP); Ippei Kume, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/827,667

(22) Filed: Aug. 17, 2015

(65) Prior Publication Data

US 2016/0056145 A1    Feb. 25, 2016

(30) Foreign Application Priority Data

Aug. 20, 2014  (JP) ................ 2014-167708

(51) Int. Cl.

| | | |
|---|---|---|
| H01L 29/778 | (2006.01) | |
| H01L 27/02 | (2006.01) | |
| H01L 29/66 | (2006.01) | |
| H01L 29/08 | (2006.01) | |
| H01L 29/10 | (2006.01) | |
| H01L 29/20 | (2006.01) | |
| H01L 29/417 | (2006.01) | |
| H01L 29/423 | (2006.01) | |

(52) U.S. Cl.
CPC ...... *H01L 27/0255* (2013.01); *H01L 29/0843* (2013.01); *H01L 29/1087* (2013.01); *H01L 29/66462* (2013.01); *H01L 29/7787* (2013.01); *H01L 29/2003* (2013.01); *H01L 29/41766* (2013.01); *H01L 29/4236* (2013.01)

(58) Field of Classification Search
CPC .................... H01L 29/778–29/7789
See application file for complete search history.

(56) References Cited

U.S. PATENT DOCUMENTS

| | | | | |
|---|---|---|---|---|
| 6,914,273 | B2 * | 7/2005 | Ren ............. | H01L 29/78 257/192 |
| 7,884,395 | B2 | 2/2011 | Saito | |
| 2008/0087912 | A1 | 4/2008 | Kaneko | |
| 2015/0243494 | A1 * | 8/2015 | Hayden ....... | H01L 21/0254 257/76 |

FOREIGN PATENT DOCUMENTS

| | | |
|---|---|---|
| JP | 2002-009253 A | 1/2002 |
| JP | 2008-124421 A | 5/2008 |
| JP | 2009-009993 A | 1/2009 |
| JP | 2013-016627 A | 1/2013 |

* cited by examiner

*Primary Examiner* — Eric Ward
(74) *Attorney, Agent, or Firm* — Shapiro, Gabor and Rosenberger, PLLC

(57) ABSTRACT

Performance of a semiconductor device is improved. The semiconductor device includes a substrate composed of silicon, a semiconductor layer composed of p-type nitride semiconductor provided on the substrate, and a transistor including a channel layer provided on the semiconductor layer. The semiconductor device further includes an n-type source region provided in the channel layer, and an n-type drain region provided in the channel layer separately from the source region in a plan view.
Each of the source region and the drain region is in contact with the semiconductor layer.

10 Claims, 21 Drawing Sheets

HIGH-ELECTRON-MOBILITY TRANSISTOR WITH PROTECTIVE DIODE

CROSS-REFERENCE TO RELATED APPLICATIONS

The disclosure of Japanese Patent Application No. 2014-167708 filed on Aug. 20, 2014 including the specification, drawings and abstract is incorporated herein by reference in its entirety.

BACKGROUND

The present invention relates to a semiconductor device. For example, the invention is preferably used for a semiconductor device including nitride semiconductor.

The nitride semiconductor such as gallium nitride (GaN) has a wide bandgap and a high electron mobility compared with silicon (Si) or gallium arsenide (GaAs). Hence, such nitride semiconductor will be promisingly used in high-voltage, high-power, or high-frequency transistors. Hence, there is now developed a power-control field effect transistor (FET) including the nitride semiconductor such as gallium nitride, i.e., a power device.

A semiconductor device including such a field effect transistor desirably includes a protection diode for protecting the field effect transistor so that the field effect transistor is prevented from being broken even if an excessive voltage is applied thereto.

Japanese Unexamined Patent Application Publication No. 2013-16627 (Patent Document 1) describes a technique on a semiconductor device including a semiconductor substrate having a silicon substrate and an npn bipolar transistor including a diffusion layer of an n-type impurity provided in the silicon substrate, and a hetero-junction transistor composed of nitride semiconductor provided on the semiconductor substrate.

Japanese Unexamined Patent Application Publication No. 2009-9993 (Patent Document 2) describes a technique on a semiconductor device in which a heterojunction field effect transistor (HFET) is provided on a silicon pin diode while being integrated with the silicon pin diode.

Japanese Unexamined Patent Application Publication No. 2002-9253 (Patent Document 3) describes a technique on a semiconductor device in which a heterojunction field effect transistor and a protection diode are monolithically provided on a substrate composed of gallium arsenide (GaAs).

Japanese Unexamined Patent Application Publication No. 2008-124421 (Patent Document 4) describes a technique on a semiconductor device including a horizontal insulated gate bipolar transistor (IGBT) provided on a semiconductor substrate.

SUMMARY

For example, for a semiconductor device including a field effect transistor provided in a nitride semiconductor layer on a substrate composed of silicon low in production cost, it is difficult to combine a protection diode having a high avalanche breakdown voltage with the field effect transistor without increasing area of the semiconductor device. In such a case, even if a field effect transistor composed of nitride semiconductor is designed for high-voltage use, a working voltage range for a semiconductor device including the field effect transistor cannot be set high, leading to degradation in performance of the semiconductor device.

Other issues and novel features will be clarified from the description of this specification and the accompanying drawings.

According to one embodiment of the invention, there is provided a semiconductor device including a substrate composed of silicon, and a field effect transistor configured of a semiconductor layer composed of nitride semiconductor of a first conductivity type provided on the substrate, and a channel layer composed of nitride semiconductor provided on the semiconductor layer. The semiconductor device further includes a source region of a second conductivity type provided in the channel layer, and a drain region of the second conductivity type provided in the channel layer separately from the source region in a plan view. Each of the source and drain regions is in contact with the semiconductor layer.

According to the one embodiment of the invention, performance of the semiconductor device is improved.

DETAILED DESCRIPTION

Although each of the following embodiments may be dividedly described in a plurality of sections or embodiments for convenience as necessary, they are not unrelated to one another except for the particularly defined case, and are in a relationship where one is a modification, a detail, supplementary explanation, or the like of part or all of another one.

In each of the following embodiments, when the number of elements and the like (including the number, a numerical value, amount, a range, etc.) are mentioned, the number is not limited to a specified number except for the particularly defined case and for the case where the number is principally clearly limited to the specified number. In other words, the number may be not less than or not more than the specified number.

In each of the following embodiments, it will be appreciated that a constitutional element (including an element step etc.) of the embodiment is not necessarily indispensable except for the particularly defined case and for the case where the constitutional element is probably indispensable in principle. Similarly, in each of the following embodiments, description on a shape of a constitutional element etc., a positional relationship, and the like is intended to include an element having a shape or the like substantially similar to that of the constitutional element except for the particularly defined case and for the case where such an element is probably not included in principle. The same holds true in each of the numerical value and the range.

Hereinafter, typical embodiments of the invention will be described in detail with reference to the accompanying drawings. In all drawings for explaining the following embodiments, components having the same function are designated by the same numeral, and duplicated description is omitted. In the following embodiments, an equivalent or similar portion is not repeatedly described except for a particularly required case.

Furthermore, a sectional diagram for explaining each embodiment may also be hatched for better viewability.

In each of the following embodiments, a range A to B means equal to or more than A and equal to or less than B.

First Embodiment

Structure of Semiconductor Device

The semiconductor device of a first embodiment includes a field effect transistor being a high electron mobility transistor (HEMT).

Figure 1:
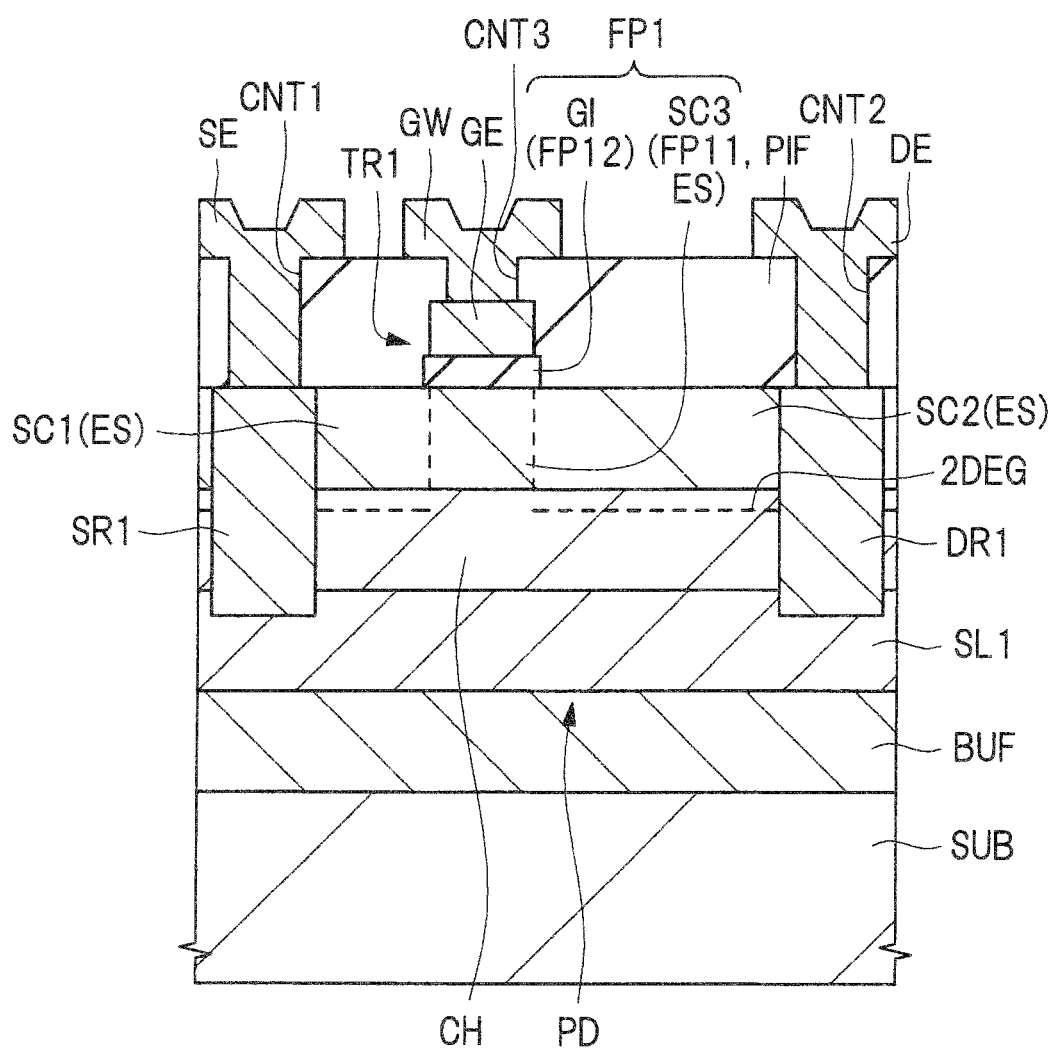
FIG. 1 is a major-part sectional diagram of a semiconductor device of a first embodiment of the invention.
Figure 2:
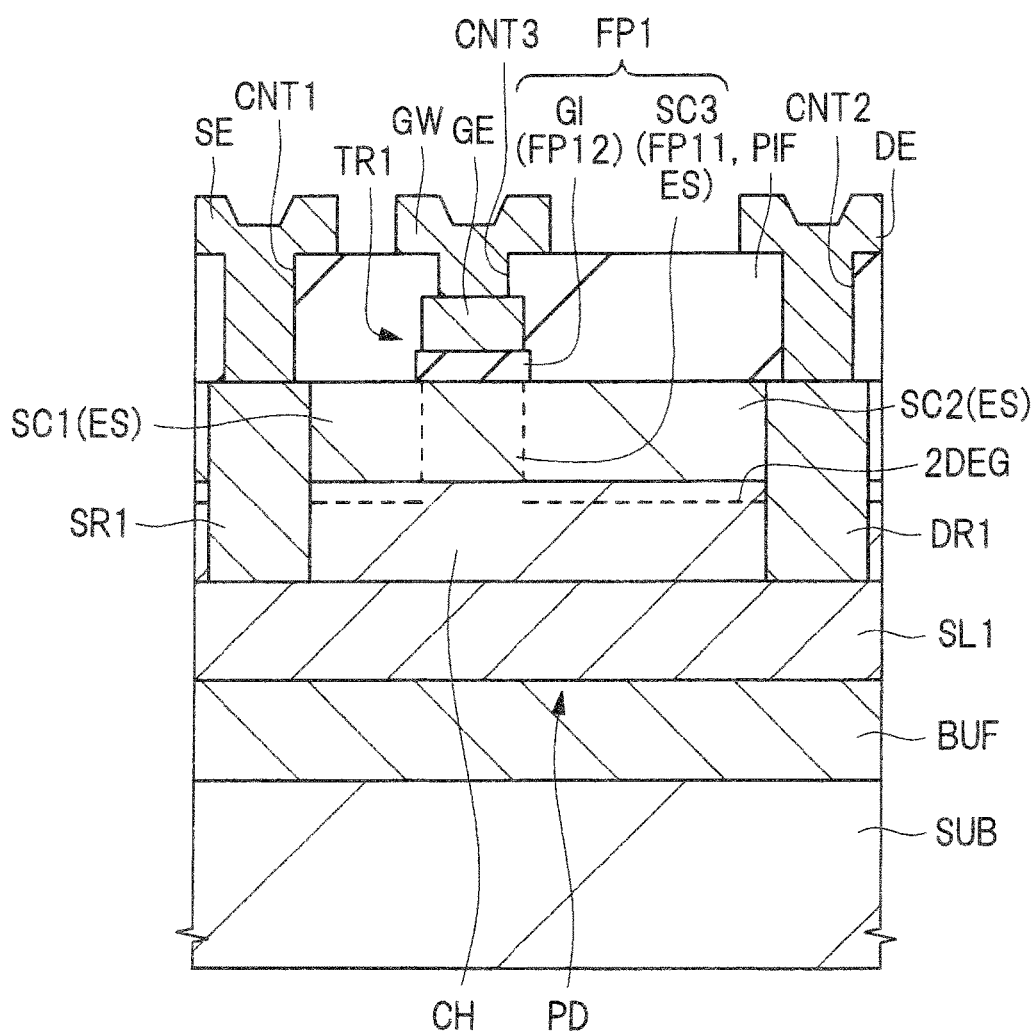
FIG. 2 is a major-part sectional diagram of a semiconductor device of a first modification of the first embodiment.
Figure 3:
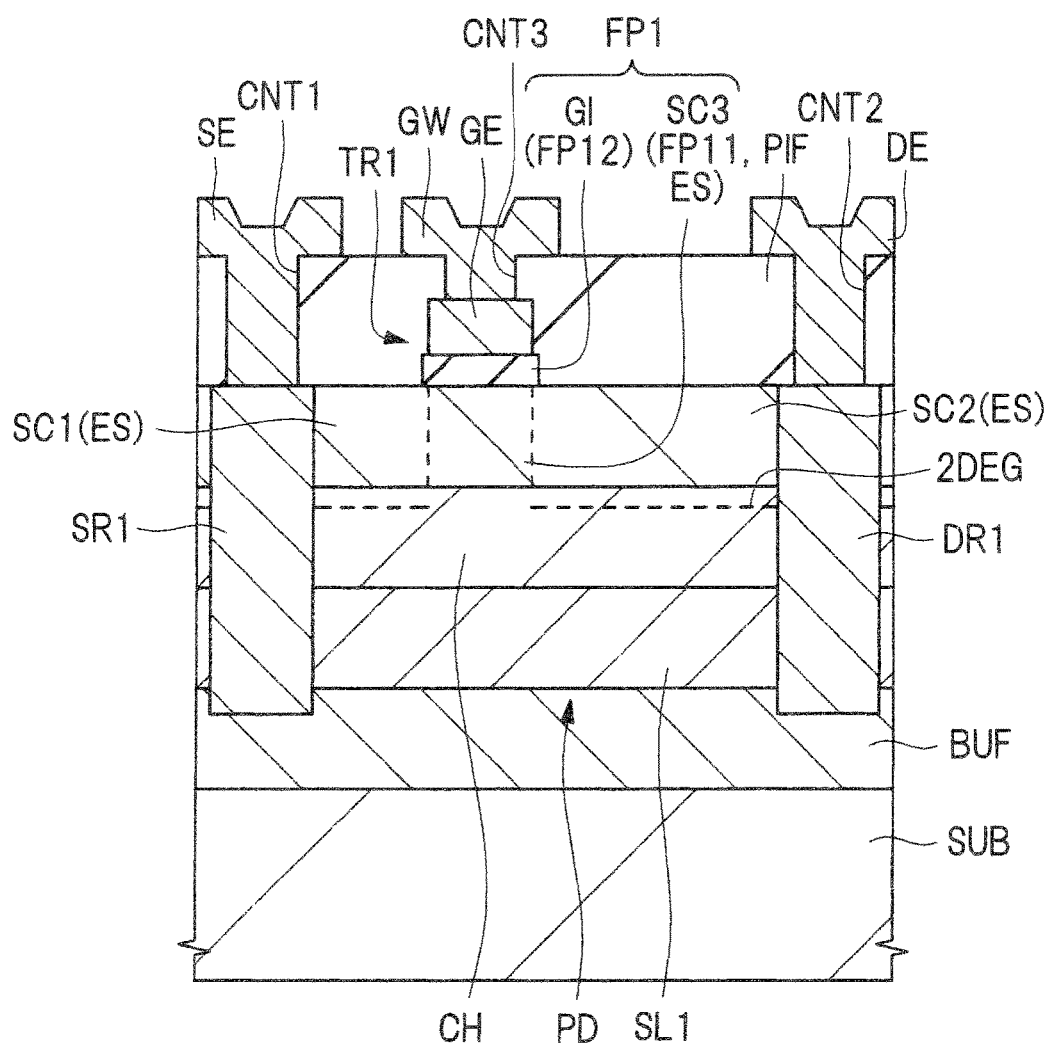
FIG. 3 is a major-part sectional diagram of a semiconductor device of a second modification of the first embodiment.

FIG. 1 is a major-part sectional diagram of a semiconductor device of the first embodiment. FIG. 2 is a major-part sectional diagram of a semiconductor device of a first modification of the first embodiment. FIG. 3 is a major-part sectional diagram of a semiconductor device of a second modification of the first embodiment.

As illustrated in FIG. 1, the semiconductor device of the first embodiment includes a substrate SUB and a transistor TR1 as a field effect transistor being a HEMT provided on the substrate SUB.

The transistor TR1 has a buffer layer BUF configured of a nitride semiconductor layer provided on the substrate SUB, and a semiconductor layer SL1 configured of a p-type nitride semiconductor layer provided on the buffer layer BUF. The transistor TR1 further has a channel layer CH configured of a nitride semiconductor layer provided on the semiconductor layer SL1, and an electron supply layer ES configured of a nitride semiconductor layer provided on the channel layer CH.

The transistor TR1 has a source region SR1 as a semiconductor region configured of a nitride semiconductor layer provided in the electron supply layer ES and the channel layer CH. The transistor TR1 further has a drain region DR1 as a semiconductor region configured of a nitride semiconductor layer provided in the electron supply layer ES and the channel layer CH separately from the source region SR1 in a plan view. Each of the source region SR1 and the drain region DR1 extends from the top of the electron supply layer ES up to the semiconductor layer SL1 through the electron supply layer ES and the channel layer CH, and is in contact with the semiconductor layer SL1.

In the description of the application, "in a plan view" refers to viewing in a direction perpendicular to the top of the substrate SUB.

The transistor TR1 further has a gate insulating film GI provided on part of the electron supply layer ES located between the source region SR1 and the drain region DR1 in a plan view, and a gate electrode GE provided on the gate insulating film GI.

In the first embodiment, the electron supply layer ES includes a nitride semiconductor region SC1 configured of a nitride semiconductor layer provided on part of the channel layer CH located between the gate electrode GE and the source region SR1 in a plan view. The electron supply layer ES further includes a nitride semiconductor region SC2 configured of a nitride semiconductor layer provided on part of the channel layer CH located between the gate electrode GE and the drain region DR1 in a plan view. Furthermore, the electron supply layer ES includes a nitride semiconductor region SC3 configured of a nitride semiconductor layer provided on part of the channel layer CH located below the gate electrode GE in a plan view. The nitride semiconductor region SC1, the nitride semiconductor region SC3, and the nitride semiconductor region SC2 are integrally provided. The nitride semiconductor region SC3 and the gate insulating film GI form a film part FP1.

The film part FP1 is configured of the nitride semiconductor region SC3 as a film part FP11 composed of nitride semiconductor and the gate insulating film GI as a film part FP12 composed of insulator, and is provided on part of the channel layer CH located between the source region SR1 and the drain region DR1 in a plan view. The gate electrode GE is provided on the channel layer CH with the film part FP1 in between.

The transistor TR1 further has a source electrode SE electrically coupled to the source region SR1, and a drain electrode DE electrically coupled to the drain region DR1.

The substrate SUB is preferably a semiconductor substrate composed of silicon (Si), i.e., single-crystal silicon substrate. This allows epitaxial growth of a nitride semiconductor layer on the substrate SUB while a large-area single-crystal substrate is used as the substrate SUB, leading to a reduction in production cost of the semiconductor device. However, the substrate SUB includes not only the semiconductor substrate composed of silicon (Si) but also various substrates each having a crystallinity necessary for the nitride semiconductor layer provided on the substrate SUB to have desired properties. The substrate SUB may therefore include, for example, a sapphire substrate, a silicon carbide (SiC) substrate, and a gallium nitride (GaN) substrate. The substrate SUB being a single-crystal silicon substrate preferably has a plane direction (111).

The buffer layer BUF is provided on the substrate SUB. The buffer layer BUF reduces a difference in lattice constant between the substrate SUB and the channel layer CH. The buffer layer BUF enables nucleation of the semiconductor layer SL1 on the substrate SUB for epitaxial growth of the semiconductor layer SL1 on the substrate SUB, i.e., acts as a nucleation layer. Alternatively, the buffer layer BUF acts as a reduction layer that reduces a difference in lattice constant between silicon (Si) composing the substrate SUB and a material such as gallium nitride (GaN) composing the semiconductor layer SL1. Examples of the buffer layer BUF include a buffer layer configured of a nitride semiconductor layer having a superlattice structure composed of aluminum nitride (AlN) and gallium nitride (GaN), for example.

When the semiconductor layer SL1 composed of gallium nitride (GaN) is directly formed on the substrate SUB composed of silicon (Si), cracks occur in the semiconductor layer SL1, and thus a good epitaxial growth layer is not ensured, and the HEMT may not be successfully fabricated. The buffer layer BUF is therefore provided between the substrate SUB and the semiconductor layer SL1. This allows easy epitaxial growth of the buffer layer BUF on the substrate SUB, and easy epitaxial growth of the semiconductor layer SL1 on the buffer layer BUF, leading to easy fabrication of the HEMT. In other words, the semiconductor layer SL1 is easily epitaxially grown on the substrate SUB with the buffer layer BUF in between, leading to easy fabrication of the HEMT.

Any material may be used for the buffer layer BUF without limitation as long as the material allows each of the semiconductor layer SL1, the channel layer CH, and the electron supply layer ES provided on the buffer layer BUF to have the crystallinity necessary for the desired properties. Hence, the buffer layer BUF includes a nitride semiconductor layer composed of gallium nitride (GaN), aluminum gallium nitride (AlGaN), or aluminum nitride (AlN), and includes a stacked film of such nitride semiconductor layers.

Alternatively, the buffer layer BUF may be configured of a nitride semiconductor layer having a superlattice structure including, for example, aluminum, nitride (AlN) and gallium nitride (GaN). When the buffer layer BUF has such a superlattice structure, the buffer layer BUF has a thickness of, for example, about 2 to 3 μm.

When the substrate SUB is, for example, a gallium nitride substrate, each of the semiconductor layer SL1, the channel layer CH, and the electron supply layer ES will maintain its crystallinity without the buffer layer BUF. The buffer layer BUF therefore may not be provided between the substrate SUB and the semiconductor layer SL1.

The semiconductor layer SL1 is provided on the buffer layer BUF, and the channel layer CH is provided on the semiconductor layer SL1. Each of the semiconductor layer SL1 and the channel layer CH is configured of a nitride semiconductor layer preferably including gallium nitride (GaN). The semiconductor layer SL1 has a thickness of, for example, about 1 to 3 μm. The channel layer CH has a thickness of, for example, about 20 to 200 nm.

The gallium nitride composing the semiconductor layer SL1 is preferably p-type gallium nitride (P-GaN) that is doped with a p-type impurity such as magnesium (Mg) and exhibits p-type conductivity. In other words, the semiconductor layer SL1 has a p-type conductivity type.

The gallium nitride composing the channel layer CH is preferably undoped gallium nitride, i.e., intrinsic gallium nitride (i-GaN) exhibiting neither n-type conductivity nor p-type conductivity. That is, the gallium nitride composing the channel layer CH does not have an n conductivity type or a p conductivity type. In other words, the gallium nitride composing the channel layer CH is not an n-type semiconductor or a p-type semiconductor. Examples of the undoped gallium nitride include a gallium nitride that is produced through crystal growth while being intentionally undoped.

The meaning of each of "a semiconductor exhibits n-type conductivity", "a semiconductor has an n conductivity type", and "a semiconductor is an n-type semiconductor" is that the majority carrier of the semiconductor is electron. The meaning of each of "a semiconductor exhibits p-type conductivity", "a semiconductor has a p conductivity type", and "a semiconductor is a p-type semiconductor" is that the majority carrier of the semiconductor is hole.

When both electrons and holes exist as carriers in a semiconductor, a difference between electron concentration and hole concentration corresponds to effective carrier concentration. In the specification of this application, "majority carrier is electron" means a state where electron concentration is higher than hole concentration, and the effective carrier concentration is more than $1 \times 10^{16}$ cm$^{-3}$. In addition, "majority carrier is hole" means a state where hole concentration is higher than electron concentration, and the effective carrier concentration is more than $1 \times 10^{16}$ cm$^{-3}$.

For example, p-type impurity concentration in the semiconductor layer SL1 is adjusted to be more than $1 \times 10^{16}$ cm$^{-3}$. This allows the effective carrier concentration in the semiconductor layer SL1 to be more than $1 \times 10^{16}$ cm$^{-3}$.

The term "intrinsic" represents a state where electron concentration is substantially equal to hole concentration, or a state where no electron or hole exists as carrier. In the specification of this application, "intrinsic" refers to a state where the effective carrier concentration is $1 \times 10^{16}$ cm$^{-3}$ or less.

The gallium nitride composing the channel layer CH is intrinsic, and thus impurity-induced reduction in electron mobility does not occur in the channel layer CH. This allows a larger amount of current to easily flow through the transistor TR1 as a field effect transistor being a HEMT.

Each of the semiconductor layer SL1 and the channel layer CH includes a nitride semiconductor layer composed of not only gallium nitride (GaN) but also aluminum gallium nitride (AlGaN), indium gallium nitride (InGaN), gallium nitride phosphide (GaNP), or indium gallium nitride phosphide (InGaNP).

Another semiconductor layer composed of, for example, undoped gallium nitride (GaN) may be provided between the semiconductor layer SL1 and the buffer layer BUF.

The electron supply layer ES is provided on the channel layer CH. The electron supply layer ES is configured of a nitride semiconductor layer different from the nitride semiconductor layer configuring the channel layer CH, for example, a nitride semiconductor layer having a bandgap different from that of the channel layer CH. The electron supply layer ES has a thickness of, for example, about 10 to 100 nm.

The electron supply layer ES preferably has a bandgap wider than that of the channel layer CH. Specifically, any of the nitride semiconductor regions SC1, SC2, and SC3 has a bandgap wider than that of the channel layer CH. Hence, when the channel layer CH is a nitride semiconductor layer composed of gallium nitride (GaN), the electron supply layer ES is preferably a nitride semiconductor layer composed of aluminum gallium nitride (AlGaN). When a composition of aluminum gallium nitride is represented by a composition formula $Al_xGa_{(1-x)}N$, x of 0.1 to 0.5 is more preferred. Specifically, a compositional ratio of aluminum amount to the total amount of aluminum and gallium is 0.1 to 0.5 in the electron supply layer ES.

For x of less than 0.1, there is a small difference in bandgap between the electron supply layer ES and the channel layer CH, possibly leading to low density of two-dimensional electron gas 2DEG generated in part of the channel layer CH located in the vicinity of an interface between the channel layer CH and the electron supply layer ES. For x of more than 0.5, there may be a large lattice mismatch between the electron supply layer ES and the channel layer CH.

Examples of the electron supply layer ES include a nitride semiconductor layer composed of not only aluminum gallium nitride (AlGaN) but also aluminum nitride (AlN), gallium nitride (GaN), indium gallium nitride (InGaN), or gallium nitride phosphide (GaNP). However, a material for the nitride semiconductor layer configuring the channel layer CH is preferably combined with a material for the nitride semiconductor layer configuring the electron supply layer ES such that the latter material has a bandgap wider than that of the former material.

The electron supply layer ES is provided on the channel layer CH in a direct contact manner, and a heterojunction is formed between the electron supply layer ES and the channel layer CH, i.e., a conduction band is discontinuous at the interface between the layers. The electron supply layer ES serves as a carrier generation region. The electron supply layer ES may contain an n-type impurity such as silicon (Si) introduced therein.

Through the electron supply layer ES and the channel layer CH, the source region SR1 and the drain region DR1, each being configured of a nitride semiconductor layer, are provided separately from each other in a plan view. A portion of the source region SR1 and a portion of the drain region DR1, each portion being provided in the electron supply layer ES, are composed of n-type aluminum gallium nitride (n-AlGaN) that is doped with an n-type impurity such as silicon (Si) and thus exhibits n-type conductivity. A portion of the source region SR1 and a portion of the drain region DR1, each portion being provided in the channel layer CH, are composed of n-type aluminum gallium nitride (n-AlGaN) that is doped with an n-type impurity such as silicon (Si) and thus exhibits n-type conductivity. In other words, each of the source region SR1 and the drain region DR1 has an n-type conductivity type. Each of the source region SR1 and the drain region DR1 extends in a direction substantially perpendicular to the paper plane of FIG. 1.

Each of the source region SR1 and the drain region DR1 extends through the electron supply layer ES and the channel layer CH, and is in contact with the semiconductor layer SL1. This results in formation of a protection diode PD configured of an npn diode below the transistor TR1 as a field effect transistor being a HEMT, the npn diode including the n-type source region SR1, the p-type semiconductor layer SL1, and the n-type drain region DR1. It is therefore possible to combine the protection diode PD, which protects the transistor TR1 as a field effect transistor being a HEMT, with the transistor TR1 without increasing area of the semiconductor device. While a high-withstand-voltage semiconductor element is formed on a substrate low in production cost such as a silicon (Si) substrate, the protection diode PD is formed in a nitride semiconductor such as gallium nitride (GaN) having a bandgap wider than that of silicon. This makes it possible to improve the withstand voltage of the protection diode.

The n-type impurity concentration in the n-type source region SR1 is adjusted to be more than $1\times10^{16}$ cm$^{-3}$. This allows effective carrier concentration in the n-type source region SR1 to be higher than $1\times10^{16}$ cm$^{-3}$. In addition, the source electrode SE is electrically coupled to the n-type source region SR1 with low resistance.

The n-type impurity concentration in the n-type drain region DR1 is adjusted to be more than $1\times10^{16}$ cm$^{-3}$. This allows effective carrier concentration in the n-type drain region DR1 to be higher than $1\times10^{16}$ cm$^{-3}$. In addition, the drain electrode DE is electrically coupled to the n-type drain region DR1 with low resistance.

Since the p-type portion of the npn diode is configured of the semiconductor layer SL1 composed of the p-type gallium nitride (p-GaN) produced by epitaxial growth, the p-type impurity concentration can be accurately controlled. Consequently, it is possible to readily adjust the avalanche breakdown voltage to a desired value, the avalanche breakdown voltage being a large reverse bias voltage that is applied to one of the two pn junctions of the npn diode, and induces avalanche breakdown and thus causes a large current flow in that pn junction.

As illustrated in FIG. 1, each of the source region SR1 and the drain region DR1 may be formed so as to extend to the inside of the semiconductor layer SL1 through the electron supply layer ES and the channel layer CH. Alternatively, as illustrated in FIG. 2 as a first modification of the first embodiment, each of the source region SR1 and the drain region DR1 may be formed so as to extend up to the top of the semiconductor layer SL1 through the electron supply layer ES and the channel layer CH. When each of the source region SR1 and the drain region DR1 is formed so as to extend to the inside of the semiconductor layer SL1 as illustrated in FIG. 1, it is not necessary to extremely accurately control the ion implantation condition for introducing the n-type impurity such as silicon (Si) into the electron supply layer ES and the channel layer CH by an ion implantation process. It is therefore possible to improve the production yield of the semiconductor device, leading to a reduction in production cost of the semiconductor device.

Alternatively, as illustrated in FIG. 3 as a second modification of the first embodiment, each of the source region SR1 and the drain region DR1 may be formed so as to extend to the inside of the buffer layer BUF through the electron supply layer ES, the channel layer CH, and the semiconductor layer SL1. This configuration maximizes the contact area of the source region SR1 and the semiconductor layer SL1, and maximizes the contact area of the drain region DR1 and the semiconductor layer SL1.

The source electrode SE is provided on the source region SR1. The drain electrode DE is provided on the drain region DR1. Each of the source electrode SE and the drain electrode DE is composed of a conductor, for example, a metal film such as a stacked film of a titanium (Ti) film and a gold (Au) film formed on the titanium film. Each of the source electrode SE and the drain electrode DE extends in a direction substantially perpendicular to the paper plane of FIG. 1.

The source electrode SE is in ohmic contact with the source region SR1, and the drain electrode DE is in ohmic contact with the drain region DR1. Specifically, the source electrode SE is electrically coupled to the source region SR1, and the drain electrode DE is electrically coupled to the drain region DR1.

The gate electrode GE is provided separately from each of the source region SR1 and the drain region DR1 on part of the electron supply layer ES located between the source region SR1 and the drain region DR1. The gate electrode GE is composed of a conductor, for example, a metal film such as a stacked film of a nickel (Ni) film and a gold (Au) film formed on the nickel film. The gate electrode GE extends in a direction substantially perpendicular to the paper plane of FIG. 1.

In the exemplary case illustrated in FIG. 1, the gate electrode GE is provided on the electron supply layer ES with the gate insulating film GI in between. As described above, when the electron supply layer ES includes the nitride semiconductor regions SC1, SC2, and SC3, the gate electrode GE is provided on the nitride semiconductor region SC3 with the gate insulating film GI in between. This decreases the gate leakage current in the transistor TR1 compared with the case where the gate electrode GE is directly in contact with the nitride semiconductor region SC3.

The gate insulating film GI preferably has a bandgap wider than that of the electron supply layer ES. Consequently, the gate insulating film GI acts as an energy barrier between the gate electrode GE and the electron supply layer ES. Thus, current flows less easily between the gate electrode GE and the gate insulating film GI because of the energy barrier therebetween. Hence, the gate leakage current in the transistor TR1 is further decreased. Examples of an insulating film for the gate insulating film GI include an insulating film composed of aluminum oxide ($Al_2O_3$) or silicon oxide ($SiO_2$).

The gate electrode GE is preferably configured of a metal film having a large work function. Such a metal film increases a flat band voltage between the gate electrode GE and the channel layer CH, and thus increases the threshold voltage of the transistor TR1. Examples of such a metal film for the gate electrode GE include a metal film composed of tungsten (W), titanium nitride (TiN), or platinum (Pt). If the gate electrode GE is brought into Schottky contact with the electron supply layer ES through appropriately preparing a material for the gate electrode GE and a material for the electron supply layer ES, the gate insulating film GI may not be provided between the gate electrode GE and the electron supply layer ES. In such a case, although the gate electrode GE is formed on the electron supply layer ES in a direct contact manner, current flows less easily between the gate electrode GE and the electron supply layer ES because of the Schottky barrier therebetween. Hence, the gate leakage current in the transistor TR1 is decreased.

As illustrated in FIG. 1, a space between the gate electrode GE and the drain electrode DE in a width direction of the gate electrode GE, i.e., in a gate length direction, is preferably larger than a space between the gate electrode GE and the source electrode SE in the gate length direction. As a result, a high maximum voltage can be applied between the drain electrode DE, which receives a higher voltage than the source electrode SE, and the gate electrode GE, compared with the case where the space between the gate electrode GE and the drain electrode DE in the gate length direction is equal to or smaller than the space between the gate electrode GE and the source electrode SE in the gate length direction.

In the exemplary case illustrated in FIG. 1, a protective insulating film PIF is provided over the electron supply layer ES, the source region SR1, and the drain region DR1 so as to cover the gate insulating film GI and the gate electrode GE. The protective insulating film PIF has therein a contact hole CNT1 that extends up to the top of the source region SR1 through the protective insulating film PIF, and a contact hole CNT2 that extends up to the top of the drain region DR1 through the protective insulating film PIF. The source electrode SE is provided on part of the source region SR1 exposed on the bottom of the contact hole CNT1 so as to fill the contact hole CNT1. The drain electrode DE is provided on part of the drain region DR1 exposed on the bottom of the contact hole CNT2 so as to fill the contact hole CNT2.

The protective insulating film PIF further has therein a contact hole CNT3 that extends up to the top of the gate electrode GE through the protective insulating film PIF. A gate electrode interconnection GW is provided on part of the gate electrode GE exposed on the bottom of the contact hole CNT3 so as to fill the contact hole CNT3.

Operation of Transistor Being HEMT

Description is now made on operation of the transistor being HEMT in the semiconductor device of the first embodiment.

In the transistor TR1 being HEMT illustrated in FIG. 1, the two-dimensional electron gas 2DEG is generated in part of the channel layer CH located in the vicinity of the interface of the channel layer CH and the electron supply layer ES. Specifically, the bandgap of, for example, gallium nitride (GaN) composing the channel layer CH is different from the bandgap of, for example, aluminum gallium nitride (AlGaN) composing the electron supply layer ES. A conduction band offset is therefore formed based on the difference in bandgap, due to which a potential well having a bottom energy lower than the Fermi level is formed in part of the channel layer CH located in the vicinity of the interface of the channel layer CH and the electron supply layer ES. As a result, the two-dimensional electron gas 2DEG is generated in part of the channel layer CH located in the vicinity of the interface of the channel layer CH and the electron supply layer ES, the partial channel layer CH excluding part of the channel layer CH located below the gate electrode GE. The two-dimensional electron gas 2DEG serves as an electron conduction channel, i.e., a conduction path, between the source region SR1 and the drain region DR1. FIG. 1 schematically shows the two-dimensional electron gas 2DEG by a broken line.

On the other hand, density of the two-dimensional electron gas 2DEG, which is generated in part of the channel layer CH located below the gate electrode GE and in the vicinity of the interface of the channel layer CH and the electron supply layer ES, varies depending on the voltage applied to the gate electrode GE. Thus, the transistor TR1 operates as a HEMT.

While no voltage is applied to the gate electrode GE, and when the two-dimensional electron gas 2DEG is generated in part of the channel layer CH located below the gate electrode GE and in the vicinity of the interface of the channel layer CH and the electron supply layer ES, the threshold voltage of the transistor TR1 lowers, and the transistor TR1 operates as a normally-on device.

In some case, energy of the conduction band of the channel layer CH rises in part of the channel layer CH located below the gate electrode GE, and energy of the potential well, which is formed in part of the channel layer CH located below the gate electrode GE and in the vicinity of the interface of the channel layer CH and the electron supply layer ES, becomes higher than the Fermi level. In such a case, while no voltage is applied to the gate electrode GE, the two-dimensional electron gas 2DEG is allowed to be not generated in part of the channel layer CH located below the gate electrode GE and in the vicinity of the interface of the channel layer CH and the electron supply layer ES. This provides a high threshold voltage of the transistor TR1, and allows the transistor TR1 to operate as a normally-off device.

Operation of Protection Diode

Figure 4:
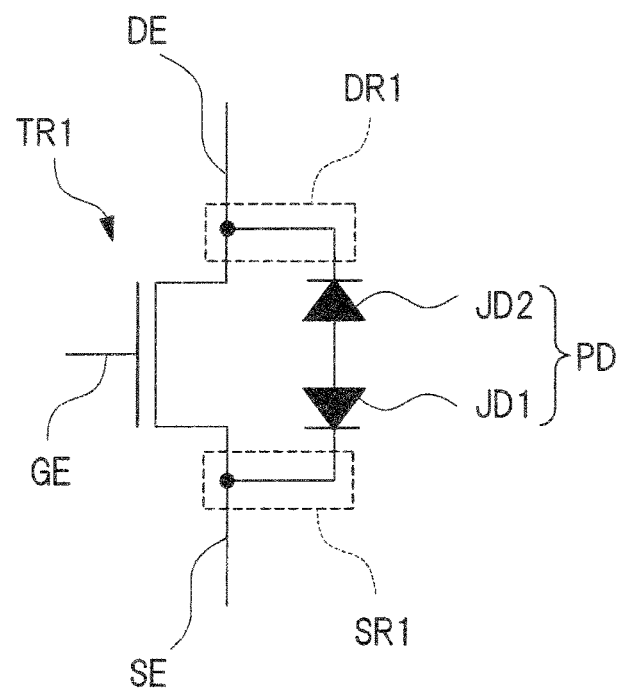
FIG. 4 is an equivalent circuit diagram of the semiconductor device of the first embodiment.
Figure 5:
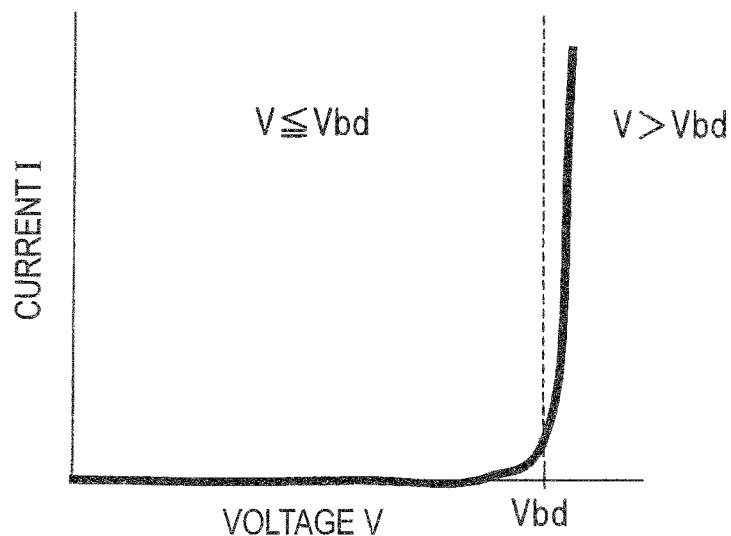
FIG. 5 is a graph schematically illustrating a current-voltage characteristic of a protection diode in the semiconductor device of the first embodiment.

Description is now made on operation of the protection diode in the semiconductor device of the first embodiment. FIG. 4 is an equivalent circuit diagram of the semiconductor device of the first embodiment. FIG. 5 is a graph schematically illustrating a current-voltage characteristic of the protection diode in the semiconductor device of the first embodiment. In FIG. 5, the horizontal axis is voltage V of the drain electrode DE relative to the source electrode SE, and the vertical axis is current I that flows from the drain electrode DE to the source electrode SE at a voltage of 0 V applied to the gate electrode GE.

As illustrated in FIG. 4, in the semiconductor device of the first embodiment, the transistor TR1 including the gate electrode GE, the source electrode SE, and the drain electrode DE is electrically coupled in parallel with the protection diode PD being an npn diode. Specifically, the protection diode PD being the npn diode is connected between the source electrode SE and the drain electrode DE of the transistor TR1. The protection diode PD being the npn diode includes two pn-junction diodes. One of the two pn-junction diodes, which is arranged on a side close to the source electrode SE, is referred to as pn-junction diode JD1, and the other of them, which is arranged on a side close to the drain electrode DE, is referred to as pn-j unction diode JD2. The two pn-junction diodes JD1 and JD2 are electrically coupled in series while sharing the p-type semiconductor.

The two pn-junction diodes JD1 and JD2 are each an avalanche diode. That is, when a large reverse bias voltage is applied to the pn junction of each diode, avalanche breakdown is induced and thus a large current flows. Hence, the protection diode PD being the npn diode including the two pn-junction diodes JD1 and JD2 is also an avalanche diode.

Description is now made with an exemplary case where a voltage applied to the drain electrode DE is higher than a voltage applied to the source electrode SE. The avalanche breakdown voltage of the pn junction diode JD2 arranged on a side close to the drain electrode DE is referred to as avalanche breakdown voltage Vbd.

As illustrated in FIG. 5, when voltage V is equal to or lower than the avalanche breakdown voltage Vbd of the pn junction diode JD2, current I is zero. At this time, the pn junction diode JD2 receives a voltage V as a reverse bias; hence, no current I flows through the pn junction diode JD2. In other words, no current I flows through the protection diode PD.

On the other hand, as illustrated in FIG. 5, when the voltage V exceeds the avalanche breakdown voltage Vbd of the pn junction diode JD2, the current I abruptly increases with the voltage V. At this time, the pn junction diode JD2 receives an excessive voltage V as a reverse bias; hence, avalanche breakdown occurs in the pn junction diode JD2, and a large current I flows through the pn junction diode JD2. In other words, the large current I flows through the protection diode PD.

A voltage at which breakdown such as dielectric breakdown occurs in the transistor TR1 is referred to as breakdown voltage. The p-type impurity concentration in the semiconductor layer SL1 and the n-type impurity concentration in the drain region DR1 are adjusted such that the avalanche breakdown voltage Vbd of the pn junction diode JD2 is lower than the breakdown voltage of the transistor TR1 and about 10% higher than the upper limit of the normal operation voltage of the transistor TR1.

Consequently, if a voltage higher than the avalanche breakdown voltage Vbd of the pn junction diode JD2 is applied to the drain electrode DE, a current is passed from the drain region DR1 to the source region SR1 though the protection diode PD, thereby breakdown such as dielectric breakdown can be prevented in the transistor TR1. When the drain electrode DE receives a voltage within a range of normal operation voltage, the transistor TR1 being a HEMT operates imperviously. Hence, the protection diode PD being the npn diode serves as a protection element that protects the transistor TR1 being a HEMT.

Likewise, the p-type impurity concentration in the semiconductor layer SL1 and the n-type impurity concentration in the source region SR1 are adjusted such that the avalanche breakdown voltage of the pn junction diode JD1 is lower than the breakdown voltage of the transistor TR1, for example. Consequently, if a voltage higher than the avalanche breakdown voltage Vbd of the pn junction diode JD1 is applied to the source electrode SE, a current is passed from the source region SR1 to the drain region DR1 though the protection diode PD, thereby breakdown such as dielectric breakdown can be prevented in the transistor TR1.

Method of Manufacturing Semiconductor Device

A method of manufacturing the semiconductor device of the first embodiment is now described. FIGS. 6 to 12 are each a major-part sectional diagram illustrating a manufacturing process of the semiconductor device of the first embodiment.

Figure 6:
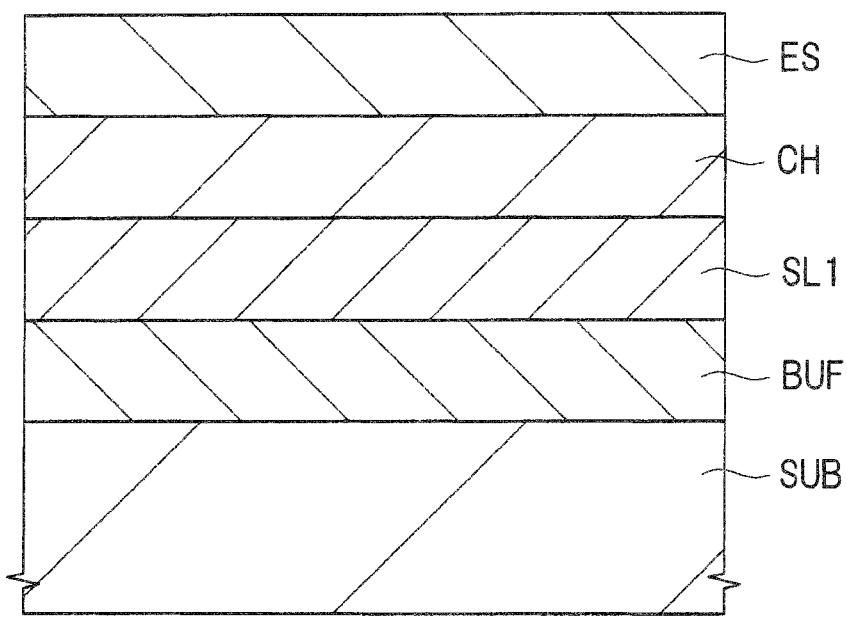
FIG. 6 is a major-part sectional diagram illustrating a manufacturing process of the semiconductor device of the first embodiment.

First, as illustrated in FIG. 6, a plurality of nitride semiconductor layers are stacked on the substrate SUB being a semiconductor substrate composed of, for example, silicon with a (111) face exposed by a metal organic chemical vapor deposition (MOCVD) process, for example.

First, the buffer layer BUF is formed on the substrate SUB. In the step of forming the buffer layer BUF, the buffer layer BUF is formed by epitaxial growth, the buffer layer BUF being configured of the nitride semiconductor layer having a superlattice structure including, for example, aluminum, nitride (AlN) and gallium, nitride (GaN). The buffer layer BUF has a thickness of, for example, about 2 to 3 μm.

Subsequently, as illustrated in FIG. 6, the semiconductor layer SL1 configured of, for example, a p-type nitride semiconductor layer is formed on the buffer layer BUF. In the step of forming the semiconductor layer SL1, the semiconductor layer SL1 composed of, for example, p-type gallium nitride is formed on the buffer layer BUF by epitaxial growth while being doped with a p-type impurity such as magnesium (Mg). The semiconductor layer SL1 has a thickness of, for example, about 1 to 3 µm. The p-type impurity concentration of the semiconductor layer SL1 is adjusted to be more than $1 \times 10^{16}$ cm$^{-3}$, for example.

When the p-type gallium nitride is produced by an ion implantation process, since the activation rate of the p-type impurity is difficult to be increased, the p-type impurity must be excessively introduced in order to ensure a desired impurity concentration. In addition, since the activation rate greatly varies, the p-type impurity concentration is difficult to be controlled. In the first embodiment, however, since the semiconductor layer SL1 composed of the p-type gallium nitride is formed by epitaxial growth, the activation rate of the p-type impurity can be increased, so that a desired impurity concentration is ensured without excessive introduction of the p-type impurity, and the p-type impurity concentration can be accurately controlled. It is therefore possible to readily adjust the avalanche breakdown voltage of the protection diode to a desired value.

When the p-type impurity is magnesium (Mg), the magnesium may become a contaminant to another semiconductor device in an in-plant manufacturing process of the semiconductor device. However, when magnesium is introduced during formation of the semiconductor layer SL1 by epitaxial growth, it is not necessary to convey a substrate such as a substrate having magnesium adhering thereon between a plurality of pieces of manufacturing equipment unlike the case where magnesium is introduced by an ion implantation process after formation of the semiconductor layer SL1. This reduces a possibility of in-plant magnesium contamination.

Subsequently, as illustrated in FIG. 6, the channel layer CH being a nitride semiconductor layer is formed on the semiconductor layer SL1. In the step of forming the channel layer CH, the channel layer CH composed of, for example, undoped gallium nitride (GaN) is formed by epitaxial growth on the semiconductor layer SL1. The channel layer CH has a thickness of, for example, about 20 to 200 nm.

Subsequently, as illustrated in FIG. 6, the electron supply layer ES is formed on the channel layer CH. In the step of forming the electron supply layer ES, the electron supply layer ES composed of, for example, undoped aluminum gallium nitride (AlGaN) is formed by epitaxial growth on the channel layer CH. The electron supply layer ES has a thickness of, for example, about 10 to 100 nm. As described above, when a composition of aluminum gallium nitride is represented by a composition formula $Al_xGa_{(1-x)}N$, x is preferably 0.1 to 0.5.

In this way, as illustrated in FIG. 6, a semiconductor layer structure configured of the buffer layer BUF, the semiconductor layer SL1, the channel layer CH, and the electron supply layer ES is formed on the substrate SUB. The semiconductor layer structure is formed through group III plane growth in which layers are successively formed in a [0001] crystal axis (C axis) direction. The two-dimensional electron gas 2DEG (see FIG. 1) is generated in part of the channel layer CH located in the vicinity of the interface of the channel layer CH and the electron supply layer ES.

Another semiconductor layer composed of undoped gallium nitride (GaN) may be formed between the semiconductor layer SL1 and the buffer layer BUF.

Figure 7:
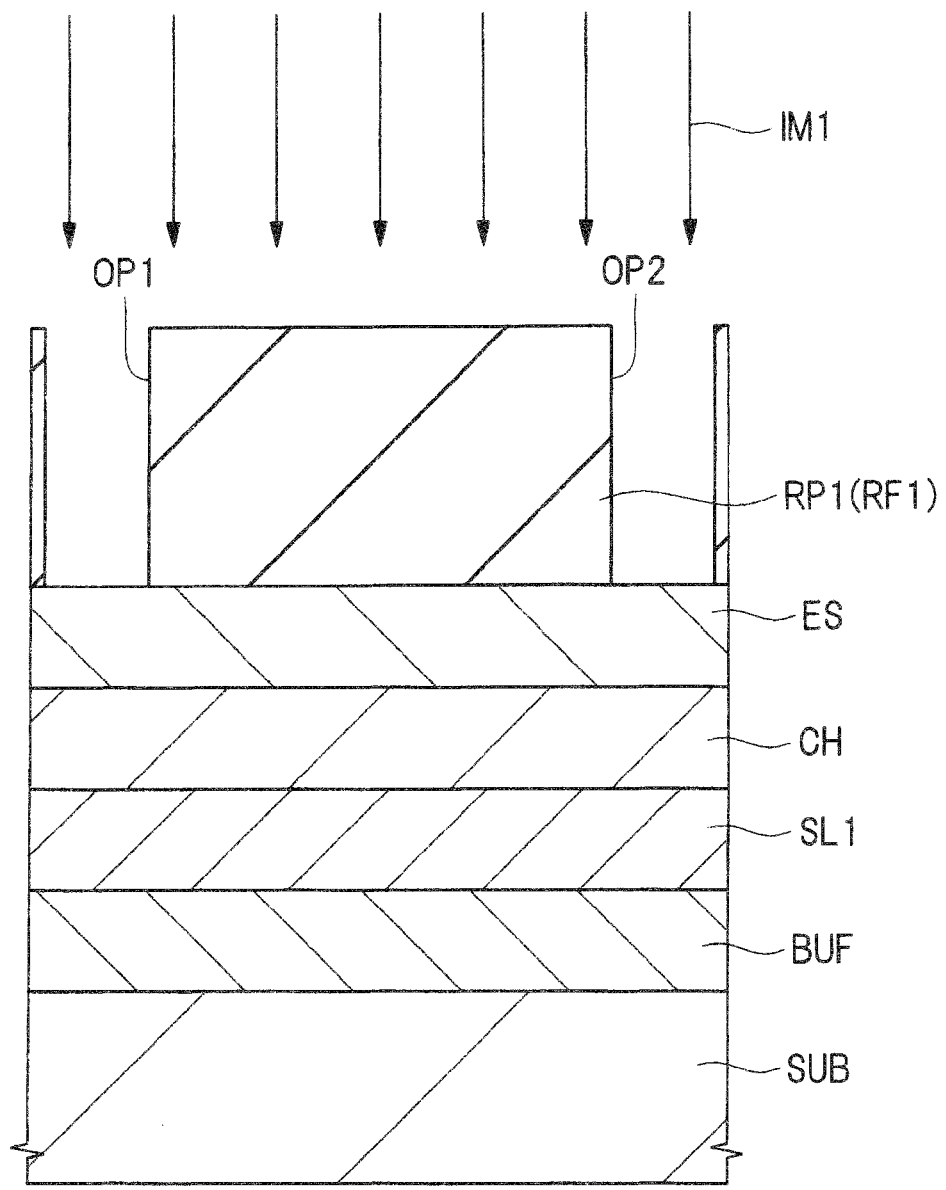
FIG. 7 is a major-part sectional diagram illustrating the manufacturing process of the semiconductor device of the first embodiment.
Figure 8:
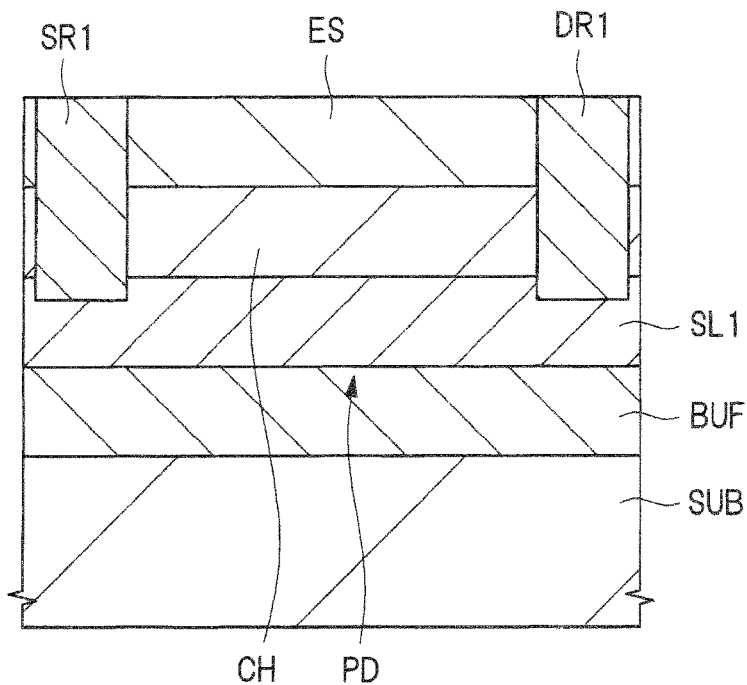
FIG. 8 is a major-part sectional diagram illustrating the manufacturing process of the semiconductor device of the first embodiment.

Subsequently, as illustrated in FIGS. 7 and 8, the source region SR1 and the drain region DR1 are formed.

In the step of forming the source region SR1 and the drain region DR1, first, as illustrated in FIG. 7, a photoresist is applied onto the electron supply layer ES to form a resist film RF1, and then the resist film RF1 is subjected to pattern exposure for development. This results in formation of openings OP1 and OP2 penetrating through the resist film RF1, leading to formation of a resist pattern RP1 configured of the resist film RF1 having the openings OP1 and OP2. The opening OP1 extends through the resist film RF1 up to the top of part of the electron supply layer ES, in which the source region SR1 (see FIG. 8) is to be formed. The opening OP2 extends through the resist film RF1 up to the top of part of the electron supply layer ES, in which the drain region DR1 (see FIG. 8) is to be formed.

Subsequently, as illustrated in FIG. 7, ion implantation is performed with the resist pattern RP1 as a mask, thereby an n-type impurity IM1 such as silicon (Si) is implanted into part of the electron supply layer ES exposed on each of the bottoms of the openings OP1 and OP2 of the resist pattern RP1. In this operation, ions are implanted while the implantation condition such as ion energy is appropriately adjusted, thereby the n-type impurity ions are implanted not only into part of the electron supply layer ES exposed on the bottom of the opening OP1 but also into part of the channel layer CH corresponding to the opening OP1 in a plan view. In addition, the n-type impurity ions are implanted not only into part of the electron supply layer ES exposed on the bottom of the opening OP2 but also into part of the channel layer CH corresponding to the opening OP2 in a plan view.

Subsequently, the resist pattern RP1, i.e., the resist film RF1 is removed, and the implanted n-type impurity is activated through heat treatment for about 20 min at about 850° C., for example. Consequently, as illustrated in FIG. 8, the source region SR1 configured of an n-type nitride semiconductor layer and the drain region DR1 configured of an n-type nitride semiconductor layer are formed in the electron supply layer ES and the channel layer CH separately from each other in a plan view. The n-type source region SR1, the p-type semiconductor layer SL1, and the n-type drain region DR1 form the protection diode PD being an npn diode.

As illustrated in FIG. 8, each of the source region SR1 and the drain region DR1 may be formed so as to extend to the inside of the semiconductor layer SL1 through the electron supply layer ES and the channel layer CH. Alternatively, as illustrated in FIG. 2 as the first modification of the first embodiment, each of the source region SR1 and the drain region DR1 may be formed so as to extend up to the top of the semiconductor layer SL1 through the electron supply layer ES and the channel layer CH. When each of the source region SR1 and the drain region DR1 is formed so as to extend to the inside of the semiconductor layer SL1 as illustrated in FIG. 8, it is not necessary to extremely accurately control the ion implantation condition for introducing the n-type impurity such as silicon (Si) into the electron supply layer ES and the channel layer CH by an ion implantation process. It is therefore possible to improve the production yield of the semiconductor device, leading to a reduction in production cost of the semiconductor device.

Alternatively, as illustrated in FIG. 3 as the second modification of the first embodiment, each of the source region SR1 and the drain region DR1 may be formed so as to extend to the inside of the buffer layer BUF through the electron supply layer ES, the channel layer CH, and the semiconductor layer SL1. This configuration maximizes the contact area of the source region SR1 and the semiconductor layer SL1, and maximizes the contact area of the drain region DR1 and the semiconductor layer SL1.

Figure 9:
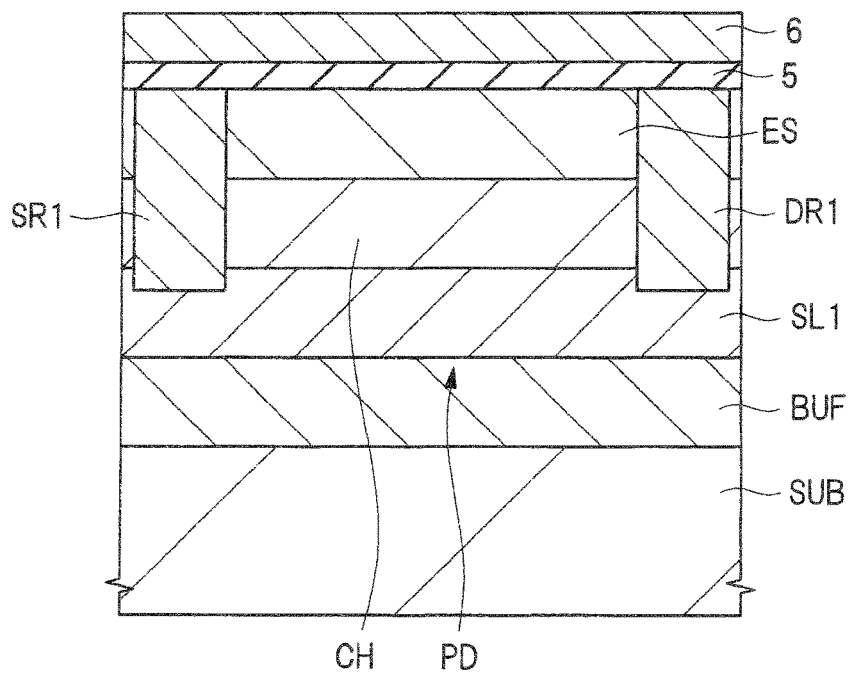
FIG. 9 is a major-part sectional diagram during the manufacturing process of the semiconductor device of the first embodiment.
Figure 10:
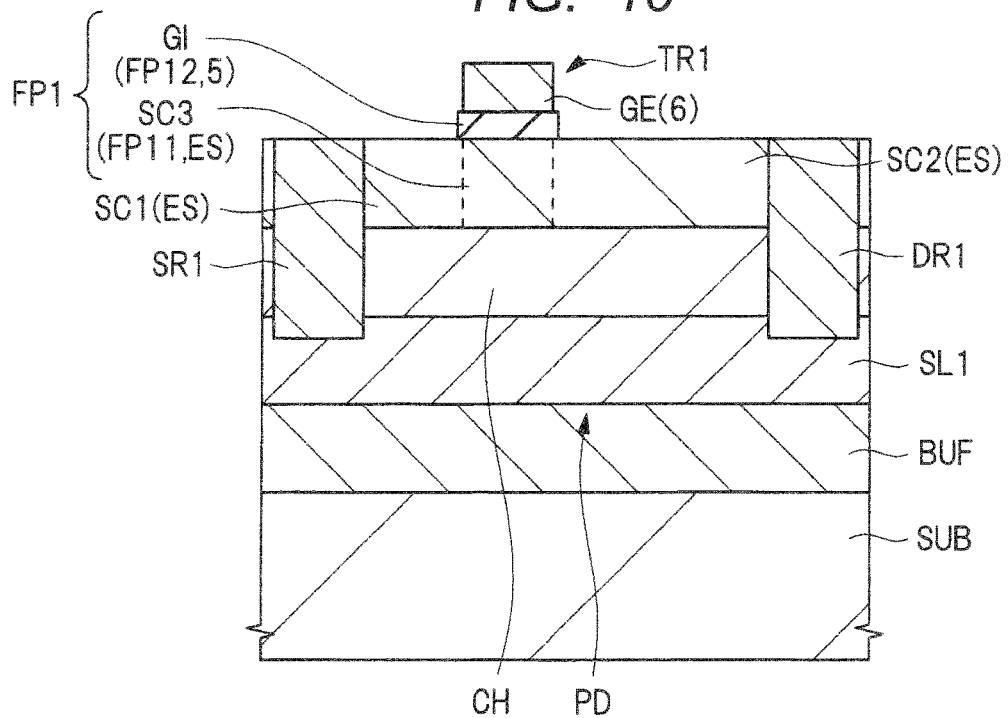
FIG. 10 is a major-part sectional diagram illustrating the manufacturing process of the semiconductor device of the first embodiment.

Subsequently, as illustrated in FIGS. 9 and 10, the gate insulating film GI and the gate electrode GE are formed.

First, as illustrated in FIG. 9, an insulating film. 5 for the gate insulating film GI is formed over the electron supply layer ES, the source region SR1, and the drain region DR1, and a metal film 6 for the gate electrode GE is formed over the insulating film 5.

Subsequently, a photoresist is applied onto the metal film 6 to form an undepicted resist film, and then the resist film is subjected to pattern exposure for development, so that an undepicted resist pattern configured of the patterned resist film is formed. The resist film is patterned such that the metal film 6 is exposed in any region other than the region where the gate electrode GE and the gate insulating film GI are formed.

Subsequently, the insulating film 5 and the metal film 6 are patterned by dry etching with the resist pattern as a mask. As illustrated in FIG. 10, this results in formation of the gate insulating film. GI configured of part of the insulating film 5 left on part of the electron supply layer ES located between the source region SR1 and the drain region DR1, and formation of the gate electrode GE configured of part of the metal film 6 left on the gate insulating film GI. Through this operation, the transistor TR1 is formed by the semiconductor layer SL1, the channel layer CH, the electron supply layer ES, the source region SR1, the drain region DR1, the gate insulating film GI, and the gate electrode GE. Subsequently, the resist film is removed.

As described above, the electron supply layer ES includes a nitride semiconductor region SC1 configured of a nitride semiconductor layer provided on part of the channel layer CH located between the gate electrode GE and the source region SR1 in a plan view. The electron supply layer ES further includes a nitride semiconductor region SC2 configured of a nitride semiconductor layer provided on part of the channel layer CH located between the gate electrode GE and the drain region DR1 in a plan view. Furthermore, the electron supply layer ES includes a nitride semiconductor region SC3 configured of a nitride semiconductor layer provided on part of the channel layer CH located below the gate electrode GE in a plan view. The nitride semiconductor region SC3 and the gate insulating film GI form a film part FP1.

The film part FP1 is configured of the nitride semiconductor region SC3 as a film part FP11 composed of nitride semiconductor, and the gate insulating film GI as a film part FP12 composed of insulator, and is provided on part of the channel layer CH located between the source region SR1 and the drain region DR1 in a plan view. The gate electrode GE is provided on the channel layer CH with the film part FP1 in between.

Figure 12:
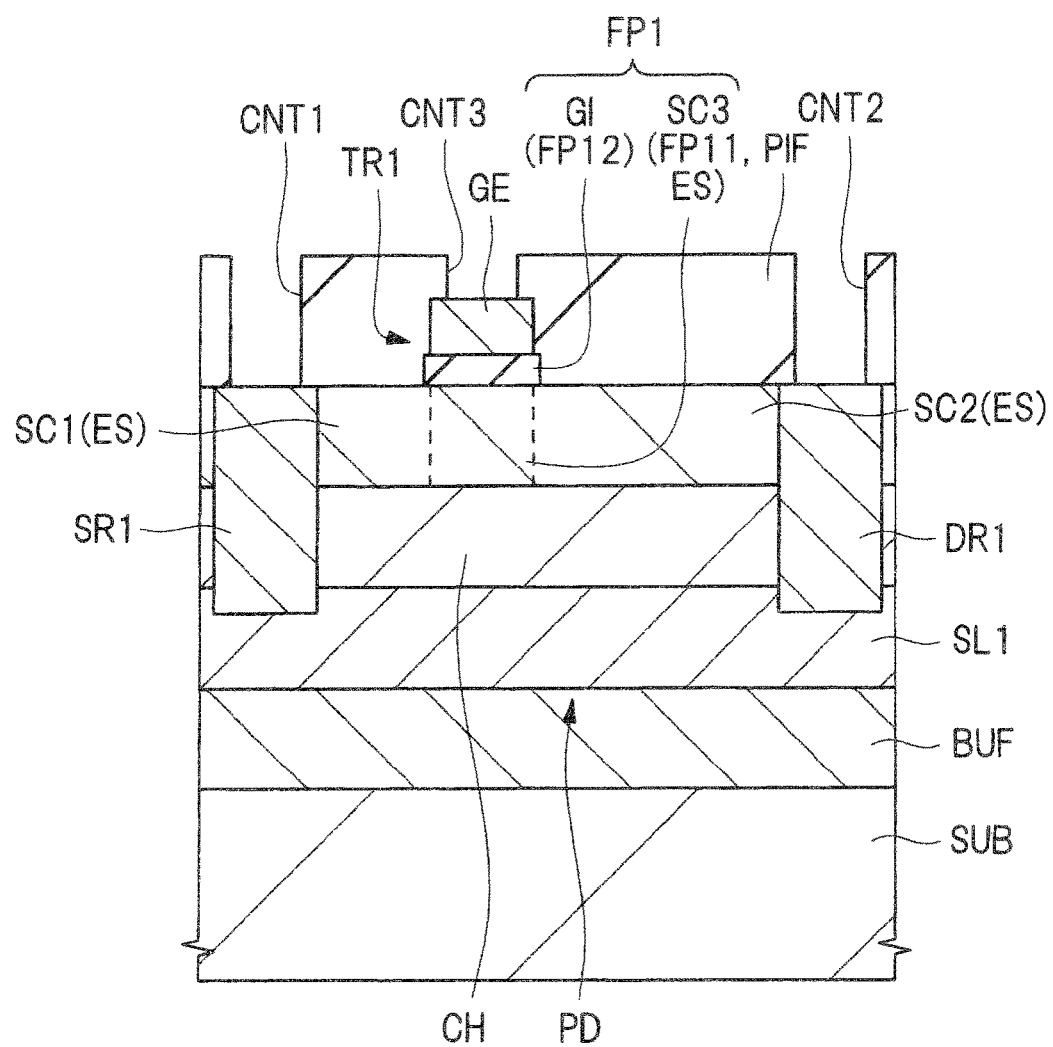
FIG. 12 is a major-part sectional diagram illustrating the manufacturing process of the semiconductor device of the first embodiment.

For patterning the metal film 6, the insulating film 5 may be patterned using the same resist pattern as that for the metal film 6. In another possible process, the metal film 6 is patterned and the resist film is removed, and then a resist pattern is formed with another resist film, and the insulating film 5 is patterned using the resist pattern. In still another possible process, the insulating film 5 is not patterned during formation of the gate electrode GE, but is patterned during patterning of the protective insulating film PIF as illustrated in FIG. 12 described later.

The insulating film 5 preferably has a bandgap wider than that of the electron supply layer ES. Consequently, the gate insulating film GI acts as an energy barrier between the gate electrode GE and the electron supply layer ES. Thus, current flows less easily between the gate electrode GE and the gate insulating film GI because of the energy barrier therebetween. Hence, the gate leakage current in the transistor TR1 is further decreased. Examples of the insulating film 5 include an insulating film composed of aluminum oxide ($Al_2O_3$) or silicon oxide ($SiO_2$).

The metal film 6 is preferably configured of a metal film having a large work function. This increases a flat band voltage between the gate electrode GE configured of the metal film 6 and the channel layer CH, and thus increases the threshold voltage of the transistor TR1. Examples of the metal film 6 include a metal film composed of tungsten (W), titanium nitride (TiN), platinum (Pt), or the like.

If the gate electrode GE is brought into Schottky contact with the electron supply layer ES through appropriately preparing a material for the gate electrode GE and a material for the electron supply layer ES, the gate insulating film GI may not be provided between the gate electrode GE and the electron supply layer ES. In such a case, although the gate electrode GE is formed on the electron supply layer ES in a direct contact manner, current flows less easily between the gate electrode GE and the electron supply layer ES because of the Schottky barrier therebetween. Hence, the gate leakage current in the transistor TR1 can be decreased.

Figure 11:
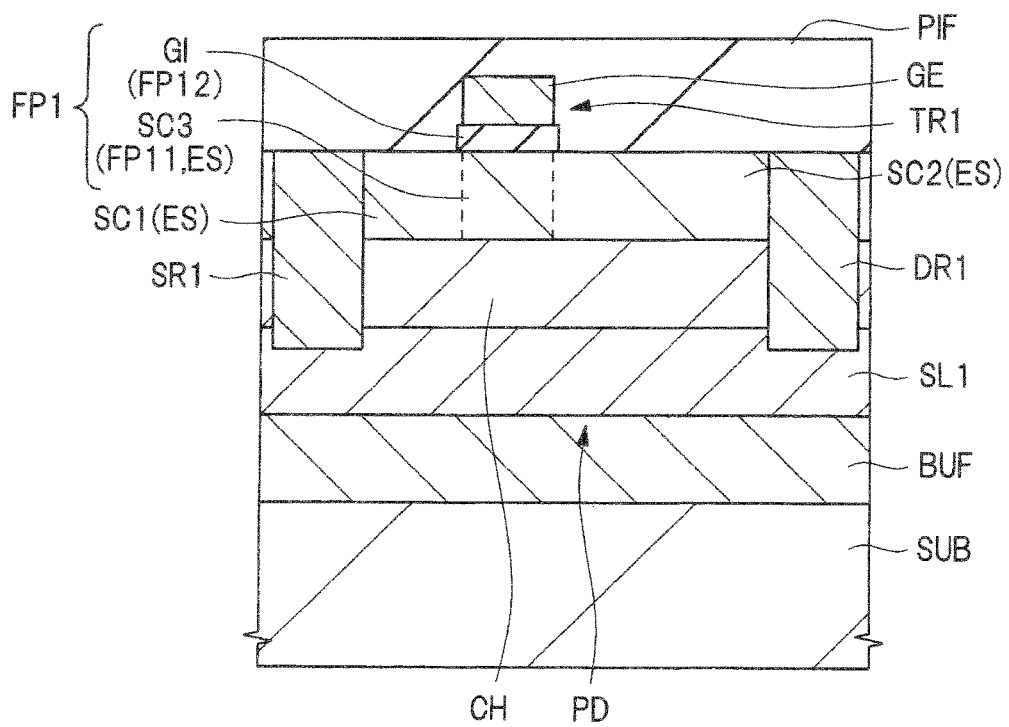
FIG. 11 is a major-part sectional diagram illustrating the manufacturing process of the semiconductor device of the first embodiment.

Subsequently, as illustrated in FIG. 11, the protective insulating film PIF is formed. In the step of forming the protective insulating film PIF, the protective insulating film PIF is formed over the electron supply layer ES, the source region SR1, and the drain region DR1 so as to cover the gate electrode GE and the gate insulating film GI. Examples of the protective insulating film PIF include an insulating film configured of a silicon oxide ($SiO_2$) film, a silicon nitride (SiN) film, or a stacked film of a silicon oxide ($SiO_2$) film and a silicon nitride (SiN) film.

Subsequently, as illustrated in FIG. 12, contact holes CNT1, CNT2, and CNT3 are formed. First, an undepicted resist film is formed on the protective insulating film PIF, and then the resist film is subjected to pattern exposure for development, resulting in formation of an undepicted resist pattern configured of the patterned resist film. The resist film is patterned such that portions of the resist film are exposed, the respective portions corresponding to the source region SR1, the drain region DR1, and the gate electrode GE in a plan view. Subsequently, the protective insulating film PIF is patterned by dry etching with the resist pattern as a mask. As illustrated in FIG. 12, this results in formation of the contact hole CNT1 that extends up to the top of the source region SR1 through the protective insulating film PIF, and formation of the contact hole CNT2 that extends up to the top of the drain region DR1 through the protective insulating film PIF. In addition, it results in formation of the contact hole CNT3 that extends up to the top of the gate electrode GE through the protective insulating film PIF. Subsequently, the resist film is removed.

Subsequently, as illustrated in FIG. 1, the source electrode SE, the drain electrode DE, and the gate electrode interconnection GW are formed. In the step of forming the source electrode SE, the drain electrode DE, and the gate electrode interconnection GW, a metal film for the source electrode SE, the drain electrode DE, and the gate electrode interconnection GW is formed in the inside of each of the contact holes CNT1, CNT2, and CNT3, and over the protective insulating film PIF. In this operation, the metal film is formed on part of the source region SR1 exposed on the bottom of the contact hole CNT1 so as to fill the contact hole CNT1, and formed on part of the drain region DR1 exposed on the bottom of the contact hole CNT2 so as to fill the contact hole CNT2. In addition, the metal film is formed on part of the gate electrode GE exposed on the bottom of the contact hole CNT3 so as to fill the contact hole CNT3. The metal film is desirably composed of a material, which is in ohmic contact with each of the source region SR1 and the drain region DR1 and is thus electrically coupled thereto with low resistance, such as an aluminum (Al) film or a stacked film of an aluminum film and a titanium nitride film.

Subsequently, the metal film is patterned by, for example, photolithography and etching, so that, as illustrated in FIG. 1, the source electrode SE, the drain electrode DE, and the gate electrode interconnection GW are formed. This is the end of manufacturing of the transistor TR1 as illustrated in FIG. 1.

Withstand Voltage of Field Effect Transistor

For a field effect transistor being, for example, a HEMT, since the HEMT has no pn junction therein, it is difficult to provide high withstand voltage against a high voltage applied to the drain electrode. In a semiconductor device including the field effect transistor being a HEMT composed of, for example, gallium nitride (GaN), the field effect transistor being the HEMT therefore may be combined with a protection diode on a substrate.

As described above with reference to FIG. 5, an avalanche diode, in which when a large reverse bias voltage is applied to the pn junction of the diode, avalanche breakdown is induced and thus a large current flows, can be used as the protection diode PD. In this case, avalanche breakdown voltage is adjusted to be high, the avalanche breakdown voltage being a large reverse bias voltage that is applied to the pn junction of the avalanche diode, and induces avalanche breakdown and thus causes a large current flow in that pn junction. Consequently, even if an excessively large current is applied to one of the electrodes, for example, the drain electrode, of the field effect transistor, the field effect transistor can be securely protected so as not to be broken.

In the technologies described in Japanese Unexamined Patent Application Publication No. 2013-16627 and Japanese Unexamined Patent Application Publication No. 2009-9993, a field effect transistor being HEMT is provided on a substrate composed of silicon (Si), and an npn bipolar transistor or a pin diode is provided as a protection diode in the substrate. However, it is difficult to increase the withstand voltage of each of the bipolar transistor and the diode formed in silicon having a bandgap narrower than that of a nitride semiconductor such as gallium nitride. In such a case, even if the HEMT composed of, for example, gallium nitride is a field effect transistor designed for high-voltage use, the protection diode has a low avalanche breakdown voltage. Hence, when the field effect transistor is used for a high-voltage application, the protection diode cannot be used as a protection element that protects the field effect transistor.

In another possible configuration of the technology described in Japanese Unexamined Patent Application Publication No. 2013-16627, a field effect transistor being a HEMT is provided on a substrate composed of gallium nitride (GaN) or silicon carbide (SiC) instead of silicon (Si), and an npn bipolar transistor as a protection diode is provided in such a substrate. In such a case, the protection diode is allowed to have a high avalanche breakdown voltage, and even if the field effect transistor is used for a high-voltage application, the protection diode can be used as a protection element that protects the field effect transistor. However, the substrate composed of gallium nitride and the substrate composed of silicon carbide are each high in production cost compared with the substrate composed of silicon, leading to high production cost of a semiconductor device.

In the technology described in Japanese Unexamined Patent Application Publication No. 2002-9253, a longitudinal pnp diode as a protection diode is provided on a lateral side of a field effect transistor being a HEMT. In such a case, the avalanche breakdown voltage of the protection diode is adjusted to be high, and thereby even if the field effect transistor is used for a high-voltage application, the protection diode can be used as a protection element that protects the field effect transistor. However, since area of a semiconductor device is increased, production cost of the semiconductor device is increased.

In this way, for the semiconductor device including the field effect transistor being a HEMT provided in the nitride semiconductor layer on the substrate composed of silicon low in production cost, the protection diode having a high avalanche breakdown voltage is difficult to be combined with the field effect transistor without increasing area of the semiconductor device.

In some case, the field effect transistor is probably a metal insulator semiconductor field effect transistor (MISFET). In such a case, for the semiconductor device including the field effect transistor provided in the nitride semiconductor layer on the substrate composed of silicon low in production cost, it is also difficult that the protection diode having a high avalanche breakdown voltage is combined with the field effect transistor without increasing area of the semiconductor device.

In such a case, even if the field effect transistor composed of nitride semiconductor is designed for high-voltage use, a working voltage range for the semiconductor device including the field effect transistor cannot be set high, leading to a degradation in performance of the semiconductor device.

In the technology described in Japanese Unexamined Patent Application Publication No. 2008-124421, p-type gallium nitride (GaN) is formed by an ion implantation process. However, the p-type impurity introduced by the ion implantation process is difficult to be activated. Hence, the p-type impurity must be excessively introduced in order to ensure a desired impurity concentration, leading to a possible reduction in electron mobility of the p-type gallium nitride.

Main Characteristics and Effects of First Embodiment

The semiconductor device of the first embodiment includes the substrate SUB composed of silicon, the semiconductor layer SL1 composed of the p-type nitride semiconductor layer provided on the substrate SUB, and the transistor TR1 as a field effect transistor including the channel layer CH composed of nitride semiconductor provided on the semiconductor layer SL1. The semiconductor device of the first embodiment further includes the source region SR1 provided in the channel layer CH, and the drain region DR1 provided in the channel layer CH separately from the source region SR1 in a plan view. Each of the source region SR1 and the drain region DR1 is in contact with the semiconductor layer SL1.

Specifically, in the semiconductor device of the first embodiment, the protection diode PD configured of the source region SR1, the semiconductor layer SL1, and the drain region DR1 is provided on the substrate SUB, and the transistor TR1 as a field effect transistor is provided on the protection diode PD.

Consequently, the protection diode can be provided in the nitride semiconductor such as gallium nitride (GaN) having a bandgap wider than silicon; hence, the avalanche breakdown voltage of the protection diode can be adjusted to be high. Hence, even if the field effect transistor is used for a high-voltage application, the protection diode can be used as a protection element that protects the field effect transistor.

The protection diode can be provided below the field effect transistor. The protection diode therefore can be combined with the field effect transistor without increasing area of the semiconductor device. In addition, it is possible to reduce mounting area of the semiconductor device and reduce the number of components in the semiconductor device compared with a technique for externally mounting a protection diode provided on a substrate different from the substrate having the field effect transistor thereon.

In other words, according to the first embodiment, for the semiconductor device including the field effect transistor being a HEMT provided in the nitride semiconductor layer on the substrate composed of silicon low in production cost, the protection diode having a high avalanche breakdown voltage can be combined with the field effect transistor without increasing area of the semiconductor device. In such a case, a working voltage range for the semiconductor device including the field effect transistor can be set high, leading to improvement in performance of the semiconductor device.

Second Embodiment

The first embodiment is described with an exemplary case where a structure having the protection diode below the field effect transistor is used in the following case: The field effect transistor is a HEMT having a usual stacked structure in which the electron supply layer is provided over the entire area of the top of part of the channel layer located in a region between the source electrode and the drain electrode, the region including a portion below the gate electrode. Specifically, in the first embodiment, the gate electrode GE is provided on the channel layer CH with the film part FP1 in between, the film part FP1 including the nitride semiconductor region SC3 composed of nitride semiconductor as a part of the electron supply layer ES.

In addition, the inventors have found that the structure having the protection diode below the field effect transistor is also satisfactorily used in the following case: The field effect transistor is not the HEMT having the usual stacked structure, but is a HEMT having a, what is called, recess structure having a recess in part of the electron supply layer located below the gate electrode. Hence, a second embodiment is described with an exemplary case where the structure having the protection diode below the field effect transistor is used in the case where the field effect transistor is the HEMT having the recess structure. Specifically, in the second embodiment, the gate electrode GE is provided on the channel layer CH with the film part FP1 in between, the film part FP1 being configured of the gate insulating film GI.

Structure and Operation of Semiconductor Device

The semiconductor device of the second embodiment also includes a field effect transistor being a HEMT as with the semiconductor device of the first embodiment. Hence, hereinafter, the semiconductor device of the second embodiment is mainly described in portions different from those of the first embodiment, and duplicated description is omitted.

Figure 13:
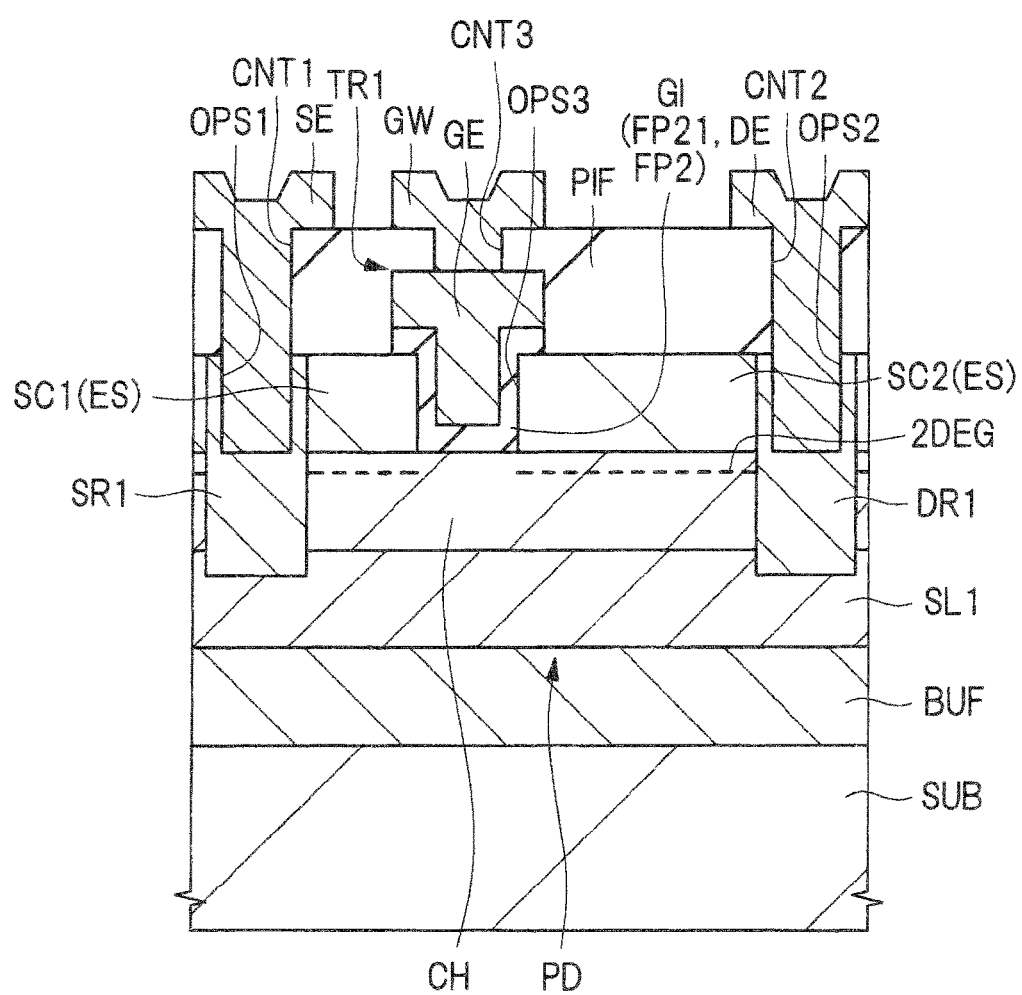
FIG. 13 is a major-part sectional diagram of a semiconductor device of a second embodiment of the invention.

FIG. 13 is a major-part sectional diagram of the semiconductor device of the second embodiment. As illustrated in FIG. 13, the semiconductor device of the second embodiment includes the substrate SUB and the transistor TR1 as the field effect transistor being a HEMT provided on the substrate SUB.

The transistor TR1 has a buffer layer BUF configured of a nitride semiconductor layer provided on the substrate SUB, and a semiconductor layer SL1 configured of a p-type nitride semiconductor layer provided on the buffer layer BUF. The transistor TR1 further has a channel layer CH configured of a nitride semiconductor layer provided on the semiconductor layer SL1, and an electron supply layer ES configured of a nitride semiconductor layer provided on the channel layer CH.

The transistor TR1 has a source region SR1 configured of a nitride semiconductor layer provided in the electron supply layer ES and the channel layer CH. The transistor TR1 has a drain region DR1 configured of a nitride semiconductor layer in the electron supply layer ES and the channel layer CH separately from the source region SR1 in a plan view. Each of the source region SR1 and the drain region DR1 extends from the top of the channel layer CH up to the semiconductor layer SL1 through the channel layer CH, and is in contact with the semiconductor layer SL1. The n-type source region SR1, the p-type semiconductor layer SL1, and the n-type drain region DR1 form the protection diode PD being an npn diode.

The second embodiment is different from the first embodiment in that an opening OPS1 is provided from the top of the source region SR1 to the inside of the source region SR1, and an opening OPS2 is provided from the top of the drain region DR1 to the inside of the drain region DR1. The opening OPS1 is in communication with the contact hole CNT1, and the opening OPS2 is in communication with the contact hole CNT2. Thus, the source electrode SE is provided on part of the source region SR1 exposed on the bottom of the opening OPS1 so as to fill the contact hole CNT1 and the opening OPS1. The drain electrode DE is provided on part of the drain region DR1 exposed on the bottom of the opening OPS2 so as to fill the contact hole CNT2 and the opening OPS2.

Preferably, the source electrode SE is electrically directly coupled to part of the source region SR1 provided in the channel layer CH without part of the source region SR1 in between, the partial source region SR1 being provided in the electron supply layer ES having a bandgap wider than that of the channel layer CH. Consequently, the source electrode SE is electrically coupled to the source region SR1 with low resistance.

Preferably, the drain electrode DE is electrically directly coupled to part of the drain region DR1 provided in the channel layer CH without part of the drain region DR1 in between, the partial drain region DR1 being provided in the electron supply layer ES having the bandgap wider than that of the channel layer CH. Consequently, the drain electrode DE is electrically coupled to the drain region DR1 with low resistance.

As illustrated in FIG. 13, each of the source region SR1 and the drain region DR1 may be formed so as to extend to the inside of the semiconductor layer SL1 through the electron supply layer ES and the channel layer CH. Alternatively, as with the exemplary case illustrated in FIG. 2 as the first modification of the first embodiment, each of the source region SR1 and the drain region DR1 may be formed so as to extend up to the top of the semiconductor layer SL1 through the electron supply layer ES and the channel layer CH. Alternatively, as with the exemplary case illustrated in FIG. 3 as the second modification of the first embodiment, each of the source region SR1 and the drain region DR1 may be formed so as to extend to the inside of the buffer layer BUF through the electron supply layer ES, the channel layer CH, and the semiconductor layer SL1.

The second embodiment is different from the first embodiment in that the transistor TR1 has an opening OPS3 that extends up to the top of the channel layer CH through part of the electron supply layer ES located between the source region SR1 and the drain region DR1 in a plan view. The transistor TR1 includes the gate insulating film GI provided on part of the channel layer CH exposed on the bottom of the opening OPS3, and the gate electrode GE provided on the gate insulating film GI.

In other words, the electron supply layer ES is not provided on the channel layer CH in a region having the opening OPS3.

In the second embodiment, the electron supply layer ES includes a nitride semiconductor region SC1 configured of a nitride semiconductor layer provided on part of the channel layer CH located between the gate electrode GE and the source region SR1 in a plan view. The electron supply layer ES further includes a nitride semiconductor region SC2 configured of a nitride semiconductor layer provided on part of the channel layer CH located between the gate electrode GE and the drain region DR1 in a plan view. The second embodiment however is different from the first embodiment in that the electron supply layer ES does not include the nitride semiconductor region SC3 (see FIG. 1) configured of a nitride semiconductor layer provided on part of the channel layer CH located below the gate electrode GE in a plan view. The gate insulating film GI forms a film part FP2.

The film part FP2 is configured of the gate insulating film GI as a film part FP21 composed of insulator, and is provided on part of the channel layer CH located between the source region SR1 and the drain region DR1 in a plan view. The gate electrode GE is provided on the channel layer CH with the film part FP2 in between.

The electron supply layer ES preferably has a bandgap wider than that of the channel layer CH. Specifically, each of the nitride semiconductor regions SC1 and SC2 has a bandgap wider than that of the channel layer CH.

The transistor TR1 has a source electrode SE electrically coupled to the source region SR1, and a drain electrode DE electrically coupled to the drain region DR1.

Operation of the transistor TR1 being HEMT in the semiconductor device of the second embodiment is similar to operation of that in the semiconductor device of the first embodiment.

In the second embodiment, the transistor TR1 being the HEMT has the, what is called, recess structure in which the opening OPS3 is provided in part of the electron supply layer ES located below the gate electrode GE. Specifically, the second embodiment does not have the part of the electron supply layer ES located below the gate electrode GE in a plan view, and has the gate electrode GE on the channel layer CH with the gate insulating film GI in between. Consequently, in the second embodiment, compared with the first embodiment, generation of the two-dimensional electron gas 2DEG is suppressed in part of the channel layer CH located below the gate electrode GE in a plan view. Specifically, density of the two-dimensional electron gas 2DEG is lower in the second embodiment than in the first embodiment, the two-dimensional electron gas 2DEG being generated in part of the channel layer CH located below the gate electrode GE and in the vicinity of the interface of the channel layer CH and the gate insulating film GI. In the second embodiment, therefore, compared with the first embodiment, it is easy to provide a high threshold voltage of the transistor TR1, and allow the transistor TR1 to operate as a normally-off device.

Hence, when the semiconductor device including a field effect transistor being a HEMT is used in electrical equipment for high-power use such as a motor or an engine control unit, and even if a control signal is stopped and is not received by the gate electrode GE, the electrical equipment including the semiconductor device can be automatically stopped. This improves safety of the electrical equipment.

Operation of Protection Diode

Operation of the protection diode PD in the second embodiment is similar to the operation of the protection diode PD described with reference to FIGS. 4 and 5 in the first embodiment. Specifically, in the second embodiment, as in the first embodiment, even if a voltage higher than the avalanche breakdown voltage Vbd of the pn junction diode JD2 is applied to the transistor TR1, current is allowed to flow through the protection diode PD, thereby the transistor TR1 can be prevented from being physically broken.

Method of Manufacturing Semiconductor Device

A method of manufacturing the semiconductor device of the second embodiment is now described. FIGS. 14 to 18 are each a major-part sectional diagram illustrating a manufacturing process of the semiconductor device of the second embodiment.

First, a plurality of nitride semiconductor layers are stacked on the substrate SUB being a semiconductor substrate composed of, for example, silicon through a process similar to the process described with reference to FIG. 6 in the first embodiment. For forming each of the nitride semiconductor layers of the buffer layer BUF, the semiconductor layer SL1, the channel layer CH, and the electron supply layer ES, a formation method, a material, and thickness can be similar to those for forming each of the nitride semiconductor layers in the process described with reference to FIG. 6 in the first embodiment.

Subsequently, the source region SR1 and the drain region DR1 are formed through a process similar to the process described with reference to FIGS. 7 and 8 in the first embodiment. Consequently, the source region SR1 configured of an n-type nitride semiconductor layer and the drain region DR1 configured of an n-type nitride semiconductor layer are formed in the electron supply layer ES and the channel layer CH separately from each other in a plan view. The n-type source region SR1, the p-type semiconductor layer SL1, and the n-type drain region DR1 form the protection diode PD being an npn diode.

As with the exemplary case illustrated in FIG. 8, each of the source region SR1 and the drain region DR1 may be formed so as to extend to the inside of the semiconductor layer SL1 through the electron supply layer ES and the channel layer CH. Alternatively, as with the exemplary case illustrated in FIG. 2 as the first modification of the first embodiment, each of the source region SR1 and the drain region DR1 may be formed so as to extend up to the top of the semiconductor layer SL1 through the electron supply layer ES and the channel layer CH. Alternatively, as with the exemplary case illustrated in FIG. 3 as the second modification of the first embodiment, each of the source region SR1 and the drain region DR1 may be formed so as to extend to the inside of the buffer layer BUF through the electron supply layer ES, the channel layer CH, and the semiconductor layer SL1.

Figure 14:
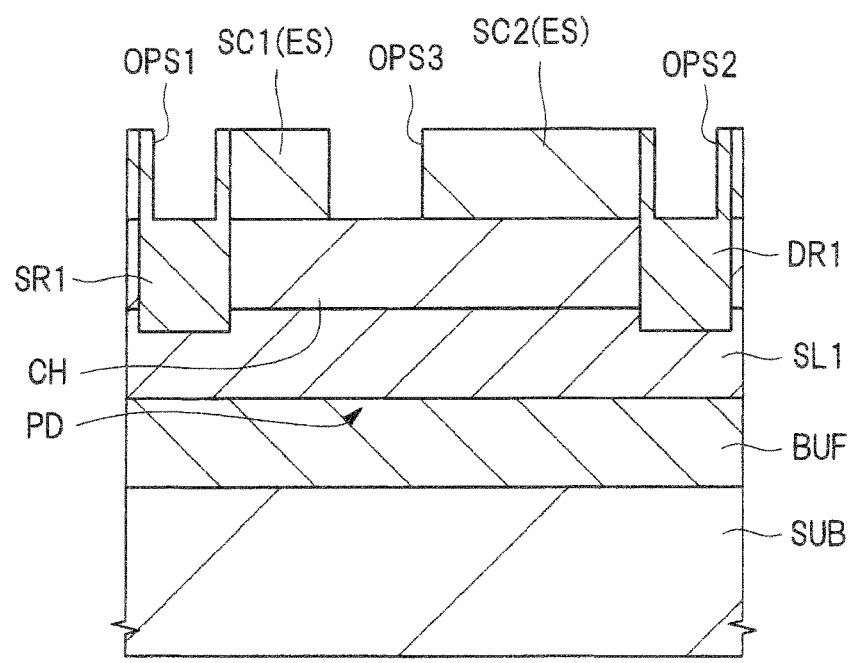
FIG. 14 is a major-part sectional diagram illustrating a manufacturing process of the semiconductor device of the second embodiment.

Subsequently, as illustrated in FIG. 14, the openings OPS1, OPS2, and OPS3 are formed. First, an undepicted resist film is formed over the source region SR1, the drain region DR1, and the electron supply layer ES, and then the resist film RF1 is subjected to pattern exposure for development, resulting in formation of an undepicted resist pattern configured of the patterned resist film. The resist film is patterned such that respective regions of the resist film are exposed, the respective regions corresponding to the openings OPS1, OPS2, and OPS3 in a plan view. Subsequently, the source region SR1, the drain region DR1, and the electron supply layer ES are patterned by dry etching with the resist pattern as a mask. As illustrated in FIG. 14, this results in formation of the opening OPS1 that extends from the top to the inside of the source region SR1, formation of the opening OPS2 that extends from the top to the inside of the drain region DR1, and formation of the opening OPS3 that extends up to the top of the channel layer CH through the electron supply layer ES. Subsequently, the resist film is removed.

Figure 15:
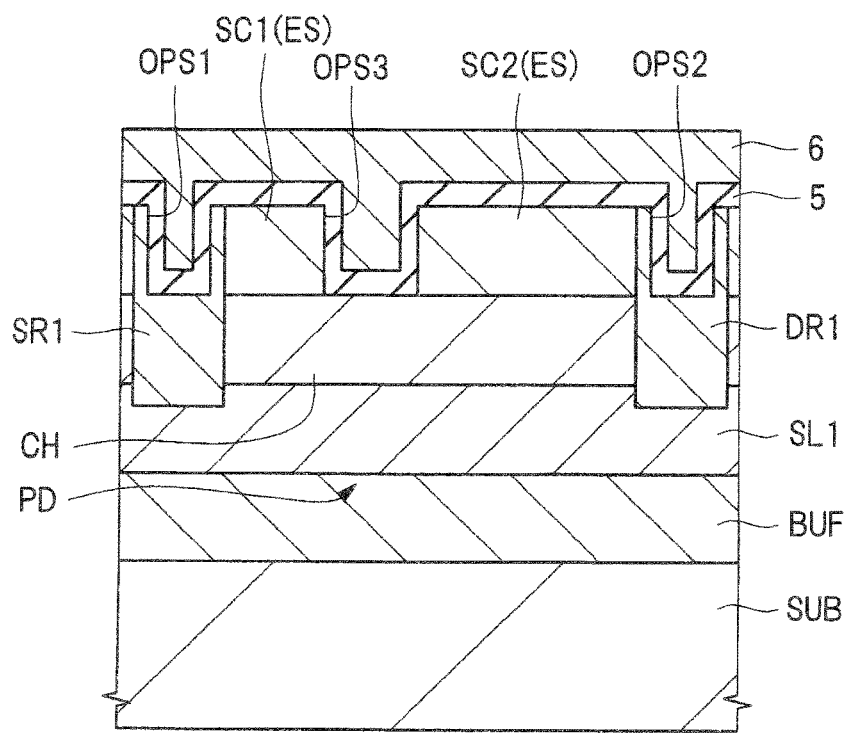
FIG. 15 is a major-part sectional diagram illustrating the manufacturing process of the semiconductor device of the second embodiment.
Figure 16:
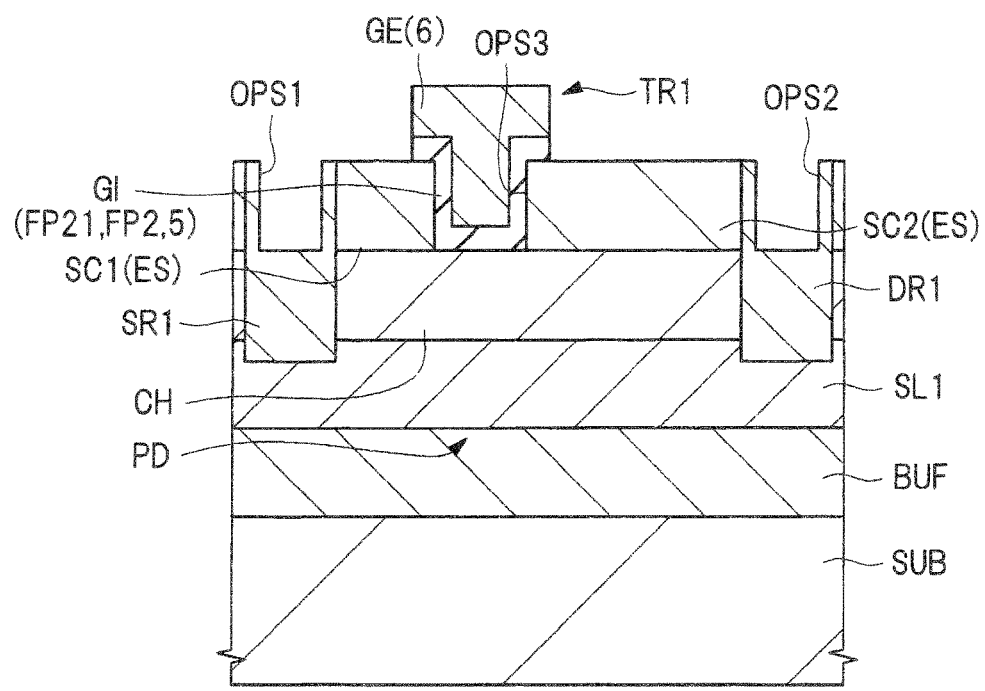
FIG. 16 is a major-part sectional diagram illustrating the manufacturing process of the semiconductor device of the second embodiment.

Subsequently, as illustrated in FIGS. 15 and 16, the gate insulating film GI and the gate electrode GE are formed.

First, through a process similar to the process described with reference to FIG. 9 in the first embodiment, as illustrated in FIG. 15, an insulating film 5 for the gate insulating film GI is formed over part of the source region SR1 exposed on the bottom of the opening OPS1, and part of the drain region DR1 exposed on the bottom of the opening OPS2. In addition, the insulating film 5 for the gate insulating film GI is formed over part of the channel layer CH exposed on the bottom of the opening OPS3 and over the electron supply layer ES. A metal film 6 for the gate electrode GE is formed over the insulating film 5.

Subsequently, the metal film 6 and the insulating film 5 are patterned through a process similar to the process described with reference to FIG. 10 in the first embodiment. As illustrated in FIG. 16, this results in formation of the gate insulating film GI configured of part of the insulating film 5 located between the source region SR1 and the drain region DR1 and left on part of the channel layer CH exposed on the bottom of the opening OPS3, and formation of the gate electrode GE configured of part of the metal film 6 left on the gate insulating film GI. Through this operation, the transistor TR1 is formed by the semiconductor layer SL1, the channel layer CH, the electron supply layer ES, the source region SR1, the drain region DR1, the gate insulating film GI, and the gate electrode GE. Subsequently, the resist film is removed.

As described above, the electron supply layer ES includes the nitride semiconductor region SC1 configured of a nitride semiconductor layer provided on part of the channel layer CH located between the gate electrode GE and the source region SR1 in a plan view. The electron supply layer ES further includes the nitride semiconductor region SC2 configured of a nitride semiconductor layer provided on part of the channel layer CH located between the gate electrode GE and the drain region DR1 in a plan view. However, the electron supply layer ES does not include the nitride semiconductor region SC3 (see FIG. 1) configured of a nitride semiconductor layer provided on part of the channel layer CH located below the gate electrode GE in a plan view. The gate insulating film GI forms the film part FP2.

The film part FP2 is configured of the gate insulating film GI as a film part FP21 composed of insulator, and is provided on part of the channel layer CH located between the source region SR1 and the drain region DR1 in a plan view. The gate electrode GE is provided on the channel layer CH with the film part FP2 in between.

Figure 17:
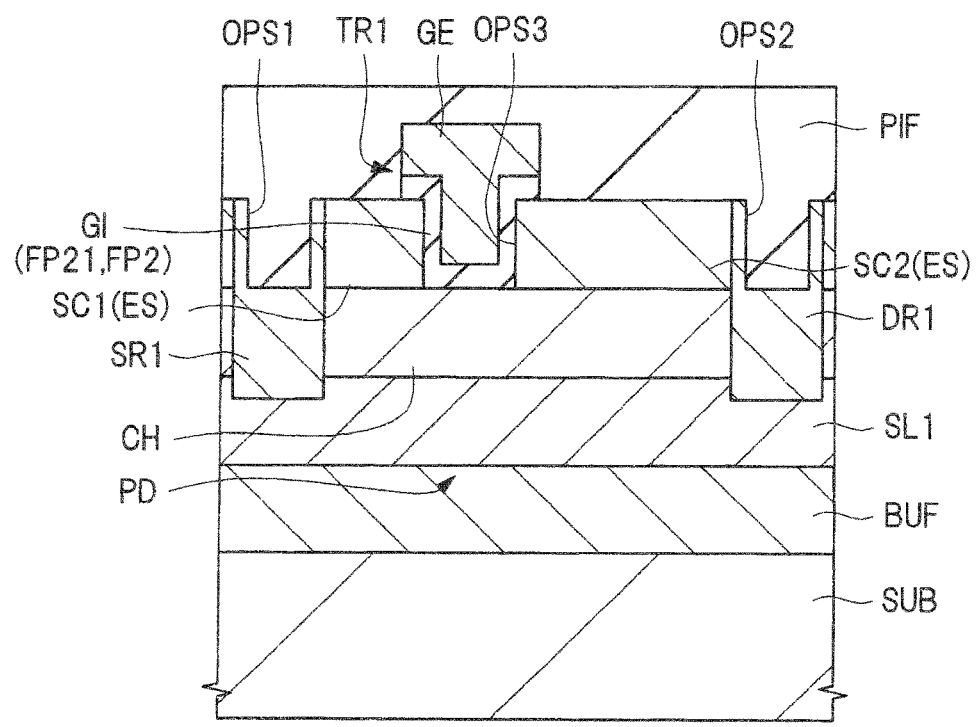
FIG. 17 is a major-part sectional diagram illustrating the manufacturing process of the semiconductor device of the second embodiment.

Subsequently, as illustrated in FIG. 17, the protective insulating film PIF is formed through a process similar to the process described with reference to FIG. 11 in the first embodiment.

Figure 18:
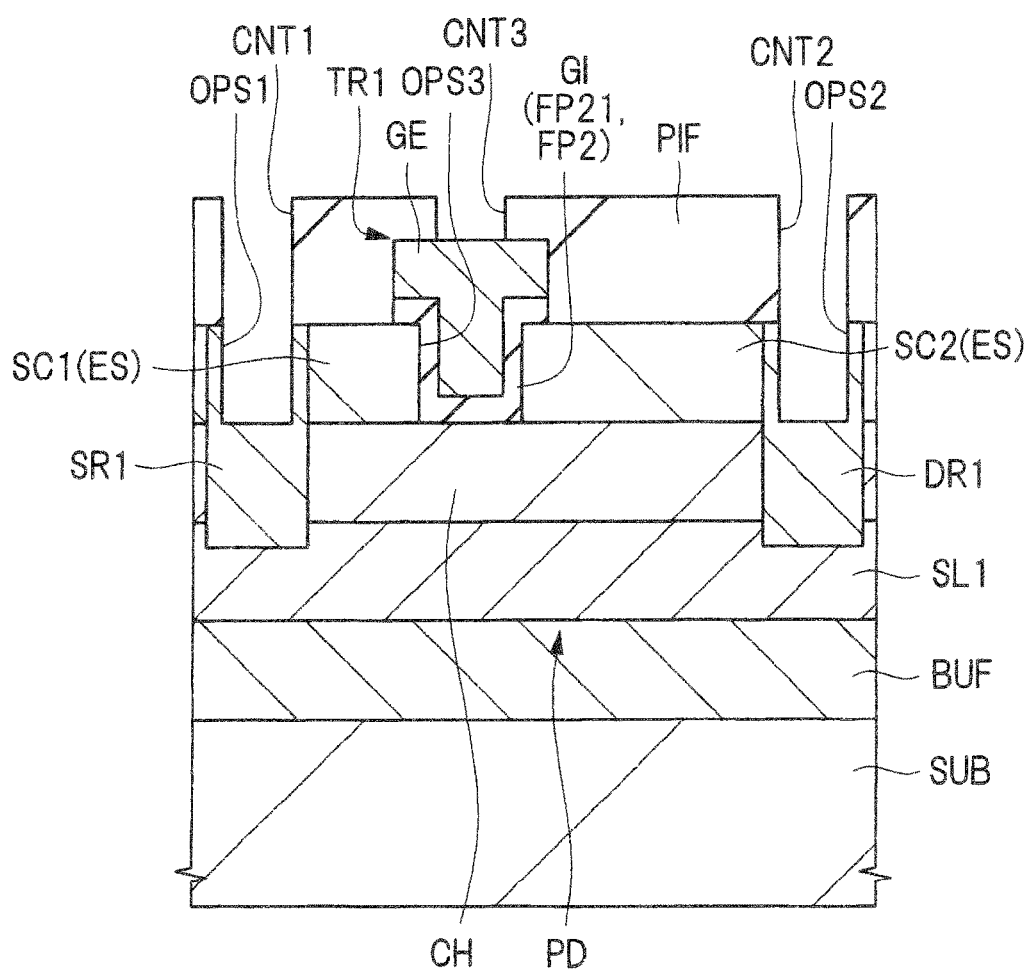
FIG. 18 is a major-part sectional diagram illustrating the manufacturing process of the semiconductor device of the second embodiment.

Subsequently, as illustrated in FIG. 18, contact holes CNT1, CNT2, and CNT3 are formed through a process similar to the process described with reference to FIG. 12 in the first embodiment. Through this operation, the protective insulating film PIF in the inside of each of the openings OPS1 and OPS2 is also removed.

Subsequently, as illustrated in FIG. 13, the source electrode SE, the drain electrode DE, and the gate electrode interconnection GW are formed through a process similar to the process described with reference to FIG. 1 in the first embodiment. This is the end of manufacturing of the transistor TR1 as illustrated in FIG. 13.

Main Characteristics and Effects of Second Embodiment

In the second embodiment, as with the first embodiment, the protection diode PD configured of the source region SR1, the semiconductor layer SL1, and the drain region DR1 is provided on the substrate SUB, and the transistor TR1 as a field effect transistor is provided on the protection diode PD. Consequently, the semiconductor device of the second embodiment exhibits effects similar to those of the semiconductor device of the first embodiment.

In the second embodiment, the field effect transistor is the HEMT having the, what is called, recess structure, and the gate electrode GE is provided on the channel layer CH with the film part FP2 composed of insulator in between. Consequently, density of the two-dimensional electron gas 2DEG is lower in the second embodiment than in the first embodiment, the two-dimensional electron gas 2DEG being generated in part of the channel layer CH located below the gate electrode GE and in the vicinity of the interface of the channel layer CH and the film part FP2. In the second embodiment, therefore, compared with the first embodiment, it is easy to provide a high threshold voltage of the transistor TR1, and allow the field effect transistor being the transistor TR1 to operate as a normally-off device.

Third Embodiment

The semiconductor device of a third embodiment corresponds to a modification of the semiconductor device of the second embodiment, in which a nitride semiconductor layer exhibiting spontaneous polarization is provided between the buffer layer BUF (see FIG. 13) and the semiconductor layer SL1 (see FIG. 13).

Structure and Operation of Semiconductor Device

The semiconductor device of the third embodiment also includes a HEMT having a recess structure as a field effect transistor as with the semiconductor device of the second embodiment.

Figure 19:
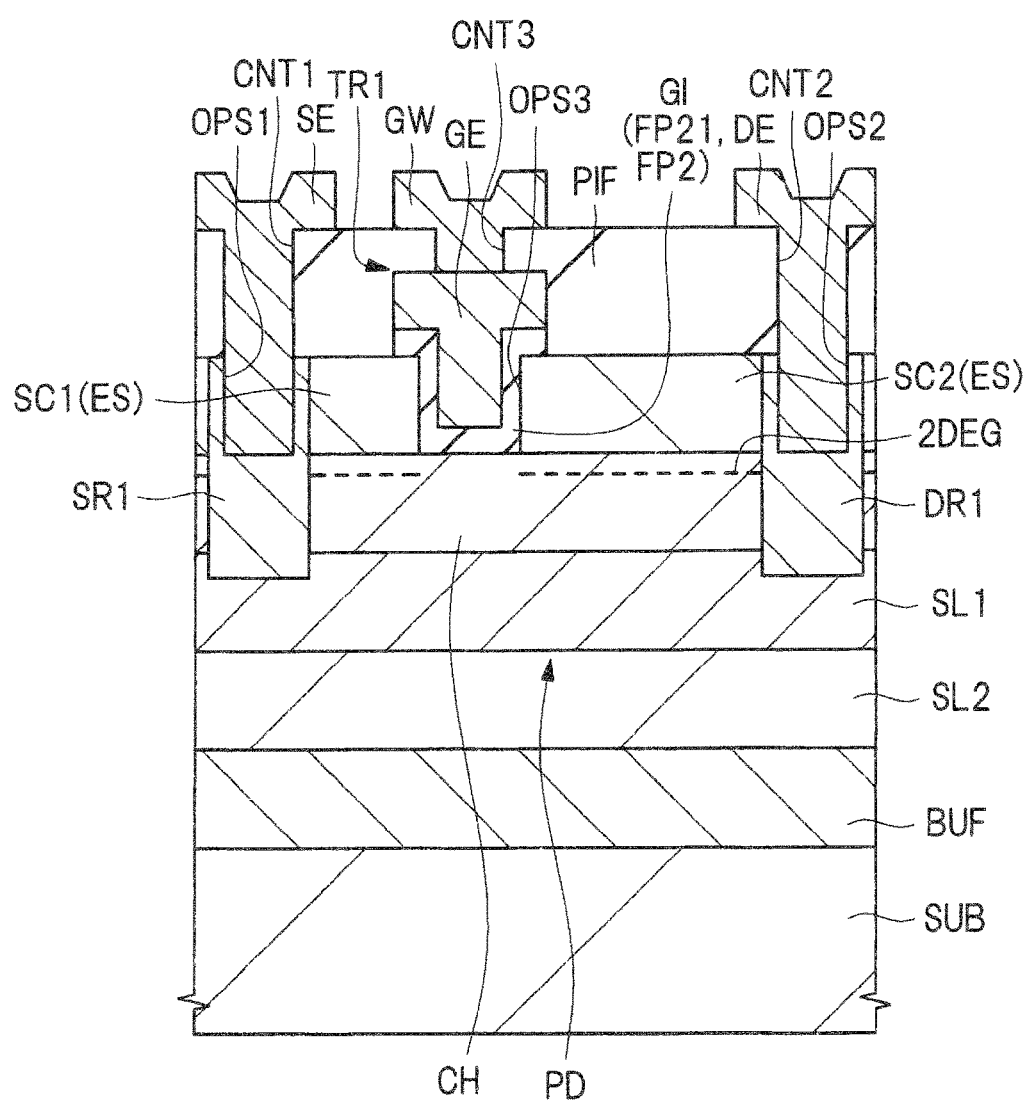
FIG. 19 is a major-part sectional diagram of a semiconductor device of a third embodiment of the invention.

FIG. 19 is a major-part sectional diagram of the semiconductor device of the third embodiment. As illustrated in FIG. 19, the semiconductor device of the third embodiment has a structure similar to the semiconductor device of the second embodiment illustrated in FIG. 13 except that a semiconductor layer SL2 configured of a nitride semiconductor layer exhibiting spontaneous polarization is provided between the buffer layer BUF and the semiconductor layer SL1.

As illustrated in FIG. 19, each of the source region SR1 and the drain region DR1 may be formed so as to extend to the inside of the semiconductor layer SL1 through the electron supply layer ES and the channel layer CH. Alternatively, as with the exemplary case illustrated in FIG. 2 as the first modification of the first embodiment, each of the source region SR1 and the drain region DR1 may be formed so as to extend up to the top of the semiconductor layer SL1 through the electron supply layer ES and the channel layer CH. Alternatively, as with the exemplary case illustrated in FIG. 3 as the second modification of the first embodiment, each of the source region SR1 and the drain region DR1 may be formed so as to extend to, for example, the inside of the semiconductor layer SL2 or the buffer layer BUF through the electron supply layer ES, the channel layer CH, and the semiconductor layer SL1.

The semiconductor device of the third embodiment is different from that of the second embodiment in that the semiconductor layer SL2 is provided on the buffer layer BUF, and the semiconductor layer SL1 is provided on the semiconductor layer SL2. The semiconductor layer SL2 has a thickness of, for example, about 1 to 2 μm.

Preferably, the semiconductor layer SL2 exhibits a larger amount of spontaneous polarization than the channel layer CH. Hence, when the channel layer CH is a nitride semiconductor layer composed of gallium nitride (GaN), the semiconductor layer SL2 is preferably a nitride semiconductor layer composed of aluminum gallium nitride (AlGaN). When a composition of aluminum gallium nitride is represented by a composition formula $Al_yGa_{(1-y)}N$, y is preferably 0.005 to 0.1. Specifically, a compositional ratio of aluminum amount to the total amount of aluminum and gallium is 0.005 to 0.1 in the semiconductor layer SL2.

For y of less than 0.005, only a small difference in amount of spontaneous polarization exists between the semiconductor layer SL2 and the channel layer CH, and an effect of forming the semiconductor layer SL2 may not be provided. On the other hand, y of more than 0.1 may increase lattice mismatch between the semiconductor layers SL2 and SL1.

The semiconductor layer SL2 may contain a p-type impurity introduced therein. When the semiconductor layer SL2 contains the p-type impurity, the semiconductor layer SL2 is allowed to operate to suppress generation of the two-dimensional electron gas 2DEG due to its spontaneous polarization, and is allowed to operate as part of the p-type semiconductor layer SL1 of the protection diode PD configured of the npn diode.

Operation of the transistor TR1 being HEMT in the semiconductor device of the third embodiment is similar to operation of that in the semiconductor device of the second embodiment.

In the third embodiment, compared with the second embodiment, generation of the two-dimensional electron gas 2DEG is suppressed by the effect of the spontaneous polarization of the semiconductor layer SL2 in part of the channel layer CH located below the gate electrode GE and in the vicinity of the interface of the channel layer CH and the electron supply layer ES. Specifically, density of the two-dimensional electron gas 2DEG is lower in the third embodiment than in the second embodiment, the two-dimensional electron gas 2DEG being generated in part of the channel layer CH located below the gate electrode GE and in the vicinity of the interface of the channel layer CH and the electron supply layer ES. In the third embodiment, therefore, compared with the second embodiment, it is further easy to provide a high threshold voltage of the transistor TR1, and allow the transistor TR1 to operate as a normally-off device.

A larger compositional ratio of aluminum amount to the total amount of aluminum and gallium increases the amount of spontaneous polarization, leading to a higher threshold voltage. A larger thickness of the channel layer CH reduces the effect of decreasing the density of the two-dimensional electron gas 2DEG by the spontaneous polarization of the semiconductor layer SL2. Hence, the total thickness of the semiconductor layer SL1 and the channel layer CH is desirably 200 nm or less.

Operation of Protection Diode

Operation of the protection diode PD in the third embodiment is also similar to operation of the protection diode PD described with reference to FIGS. 4 and 5 in the first embodiment. Specifically, in the third embodiment, as in the first embodiment, even if a voltage higher than the avalanche breakdown voltage Vbd of the pn junction diode JD2 is applied to the transistor TR1, current is allowed to flow through the protection diode PD, thereby the transistor TR1 can be prevented from being physically broken.

Method of Manufacturing Semiconductor Device

Figure 20:
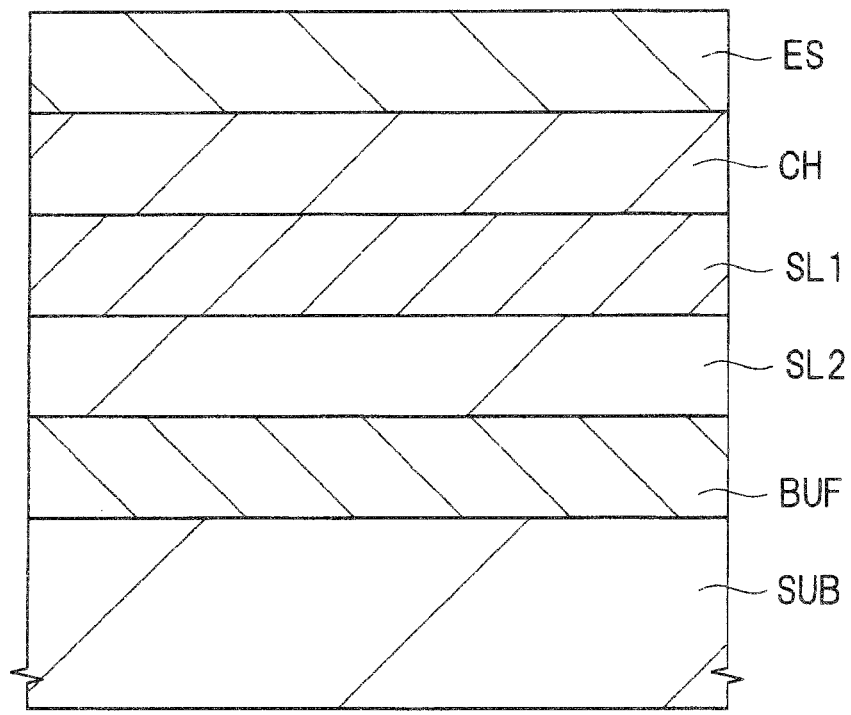
FIG. 20 is a major-part sectional diagram illustrating a manufacturing process of the semiconductor device of the third embodiment.

A method of manufacturing the semiconductor device of the third embodiment is now described. FIG. 20 is a major-part sectional diagram illustrating a manufacturing process of the semiconductor device of the third embodiment.

First, as illustrated in FIG. 20, a plurality of nitride semiconductor layers are stacked on the substrate SUB being a semiconductor substrate composed of, for example, silicon through a process similar to part of the process described with reference to FIG. 6 in the first embodiment. In the process illustrated in FIG. 20, a semiconductor layer SL2 is formed in addition to the buffer layer BUF, the semiconductor layer SL1, the channel layer CH, and the electron supply layer ES. For forming each of the nitride semiconductor layers of the buffer layer BUF, the semiconductor layer SL1, the channel layer CH, and the electron supply layer ES, a formation method, a material, and thickness can be similar to those for forming each of the nitride semiconductor layers in the process described with reference to FIG. 6 in the first embodiment.

Specifically, the buffer layer BUF is formed on the substrate SUB through a process similar to part of the process described with reference to FIG. 6 in the first embodiment, and then the semiconductor layer SL2 configured of a nitride semiconductor layer exhibiting spontaneous polarization is formed on the buffer layer BUF. In the step of forming the semiconductor layer SL2, the semiconductor layer SL2 composed of, for example, aluminum gallium nitride (AlGaN) is formed on the buffer layer BUF by epitaxial growth. The semiconductor layer SL2 has a thickness of, for example, about 1 to 2 μm. As described above, when a composition of aluminum gallium nitride is represented by a composition formula $Al_yGa_{(1-y)}N$, y is preferably 0.005 to 0.1.

Specifically, the semiconductor layer SL1 is formed on the semiconductor layer SL2 through a process similar to part of the process described with reference to FIG. 6 in the first embodiment, and then the channel layer CH is formed on the semiconductor layer SL1, and the electron supply layer ES is formed on the channel layer CH.

Subsequently, as illustrated in FIG. 19, the transistor TR1 is manufactured through a process similar to the process described with reference to FIGS. 14 to 18 in the second embodiment.

Main Characteristics and Effects of Second Embodiment

In the third embodiment, as with the first embodiment, the protection diode PD configured of the source region SR1, the semiconductor layer SL1, and the drain region DR1 is provided on the substrate SUB, and the transistor TR1 as a field effect transistor is provided on the protection diode PD. Consequently, the semiconductor device of the third embodiment exhibits effects similar to those of the semiconductor device of the first embodiment.

In the third embodiment, as with the second embodiment, the field effect transistor is a HEMT having a, what is called, recess structure, and the gate electrode GE is provided on the channel layer CH with the film part FP2 composed of insulator in between. Consequently, as with the second embodiment, density of the two-dimensional electron gas 2DEG is lower in the third embodiment than in the first embodiment, the two-dimensional electron gas 2DEG being generated in part of the channel layer CH located below the gate electrode GE and in the vicinity of the interface of the channel layer CH and the film part FP2.

In the third embodiment, the semiconductor layer SL2 configured of a nitride semiconductor layer exhibiting spontaneous polarization is provided between the buffer layer BUF and the semiconductor layer SL1. The semiconductor layer SL2 exhibits a larger amount of spontaneous polarization than the channel layer CH. Consequently, density of the two-dimensional electron gas 2DEG is still lower in the third embodiment than in the second embodiment, the two-dimensional electron gas 2DEG being generated in part of the channel layer CH located below the gate electrode GE and in the vicinity of the interface of the channel layer CH and the film part FP2. In the third embodiment, therefore, compared with the second embodiment, it is further easy to raise the threshold voltage of the transistor TR1, and allow the field effect transistor being the transistor TR1 to operate as a normally-off device.

Fourth Embodiment

The first embodiment is described with an exemplary case where a structure having the protection diode below the field effect transistor is used in the following case: The field effect transistor is the HEMT in which two-dimensional electron gas is generated in the channel layer. On the other hand, a fourth embodiment is described with an exemplary case where the structure having the protection diode below the field effect transistor is used in the following case: The field effect transistor is a MISFET in which a channel region is provided in a channel layer.

Structure and Operation of Semiconductor Device

The semiconductor device of the fourth embodiment is different from the semiconductor device of the first embodiment in that a MISFET is provided as the field effect transistor.

Figure 21:
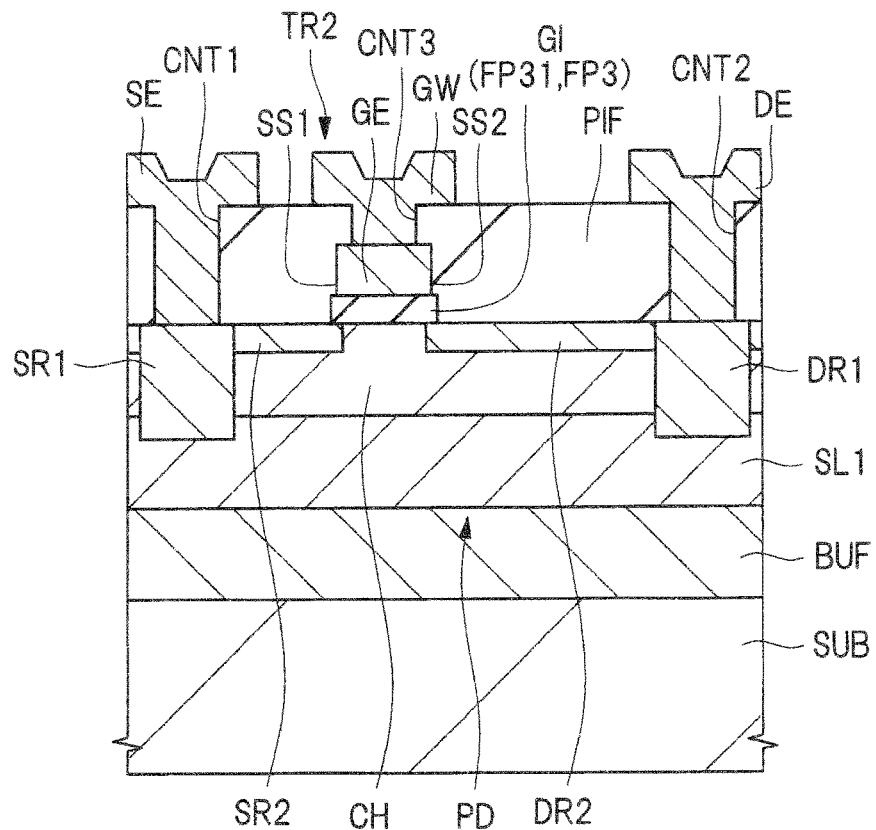
FIG. 21 is a major-part sectional diagram of a semiconductor device of a fourth embodiment of the invention.

FIG. 21 is a major-part sectional diagram of the semiconductor device of the fourth embodiment. As illustrated in FIG. 21, the semiconductor device of the fourth embodiment includes a substrate SUB and a transistor TR2 as the field effect transistor being a MISFET provided on the substrate SUB.

The transistor TR2 has the buffer layer BUF configured of a nitride semiconductor layer provided on the substrate SUB, the semiconductor layer SL1 configured of a p-type nitride semiconductor layer provided on the buffer layer BUF, and the channel layer CH configured of a nitride semiconductor layer provided on the semiconductor layer SL1.

The transistor TR2 further has the source region SR1 configured of a nitride semiconductor layer provided in the channel layer CH, and the drain region DR1 configured of a nitride semiconductor layer in the channel layer CH separately from the source region SR1 in a plan view. Each of the source region SR1 and the drain region DR1 extends from the top of the channel layer CH up to the semiconductor layer SL1 through the channel layer CH, and is in contact with the semiconductor layer SL1. The n-type source region SR1, the p-type semiconductor layer SL1, and the n-type drain region DR1 form the protection diode PD being an npn diode.

As illustrated in FIG. 21, each of the source region SR1 and the drain region DR1 may be formed so as to extend from the top of the channel layer CH to the inside of the semiconductor layer SL1 through the channel layer CH. Alternatively, as with the exemplary case illustrated in FIG. 2 as the first modification of the first embodiment, each of the source region SR1 and the drain region DR1 may be formed so as to extend from the top of the channel layer CH up to the top of the semiconductor layer SL1 through the channel layer CH. Alternatively, as with the exemplary case illustrated in FIG. 3 as the second modification of the first embodiment, each of the source region SR1 and the drain region DR1 may be formed so as to extend from the top of the channel layer CH to the inside of the buffer layer BUF through the channel layer CH and the semiconductor layer SL1.

The transistor TR2 further has the gate insulating film GI provided on part of the channel layer CH located between the source region SR1 and the drain region DR1, and the gate electrode GE provided on the gate insulating film GI in a plan view.

In the fourth embodiment, the gate insulating film GI forms a film part FP3. The film part FP3 is configured of the gate insulating film GI as a film part FP31 composed of insulator, and is provided on part of the channel layer CH located between the source region SR1 and the drain region DR1 in a plan view. The gate electrode GE is provided on the channel layer CH with the film part FP3 in between.

The transistor TR2 has the source electrode SE electrically coupled to the source region SR1, and the drain electrode DE electrically coupled to the drain region DR1.

The fourth embodiment is different from the first embodiment in that the transistor TR2 has the n-type semiconductor region SR2 provided in an upper portion of part of the channel layer CH adjacent to a side face SS1, which is close to the source region SR1, of the gate electrode GE in a plan view. The transistor TR2 further has an n-type semiconductor region DR2 provided in an upper portion of part of the channel layer CH adjacent to a side face SS2, which is close to the drain region DR1, of the gate electrode GE in a plan view.

The semiconductor region SR2 is in contact with the source region SR1. The semiconductor region DR2 is in contact with the drain region DR1. The n-type impurity concentration of the semiconductor region SR2 is lower than that of the source region SR1. The n-type impurity concentration of the semiconductor region DR2 is lower than that of the drain region DR1. This results in formation of a lightly doped drain (LDD) structure configured of the semiconductor region SR2 as an LDD region and the source region SR1, and formation of an LDD structure configured of the semiconductor region DR2 as a LDD region and the drain region DR1.

In the transistor TR2 being the MISFET illustrated in FIG. 21, when a voltage exceeding the threshold voltage is applied to the gate electrode GE, an inversion layer is formed in the vicinity of the top of part of the channel layer CH located below the gate electrode GE. The inversion layer acts as an electron conduction channel, i.e., a conduction path, between the source region SR1 and the drain region DR1, so that the transistor TR2 is turned on.

Operation of Protection Diode

Operation of the protection diode PD in the fourth embodiment is also similar to operation of the protection diode PD described with reference to FIGS. 4 and 5 in the first embodiment. Specifically, in the fourth embodiment, as in the first embodiment, even if a voltage higher than the avalanche breakdown voltage Vbd of the pn junction diode JD2 is applied to the transistor TR2, current is allowed to flow through the protection diode PD, thereby the transistor TR2 can be prevented from being physically broken.

Method of Manufacturing Semiconductor Device

A method of manufacturing the semiconductor device of the fourth embodiment is now described. FIGS. 22 to 28 are each a major-part sectional diagram illustrating a manufacturing process of the semiconductor device of the fourth embodiment.

Figure 22:
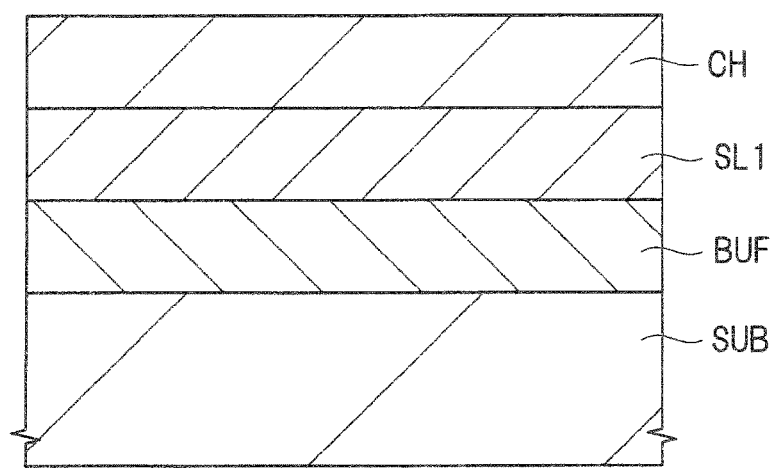
FIG. 22 is a major-part sectional diagram illustrating a manufacturing process of the semiconductor device of the fourth embodiment.

First, as illustrated in FIG. 22, the buffer layer BUF, the semiconductor layer SL1, and the channel layer CH are formed on the substrate SUB being a semiconductor substrate composed of, for example, silicon through a process similar to part of the process described with reference to FIG. 6 in the first embodiment.

Subsequently, as illustrated in FIGS. 23 to 26, the semiconductor regions SR2 and DR2, the source region SR1, and the drain region DR1 are formed.

Figure 23:
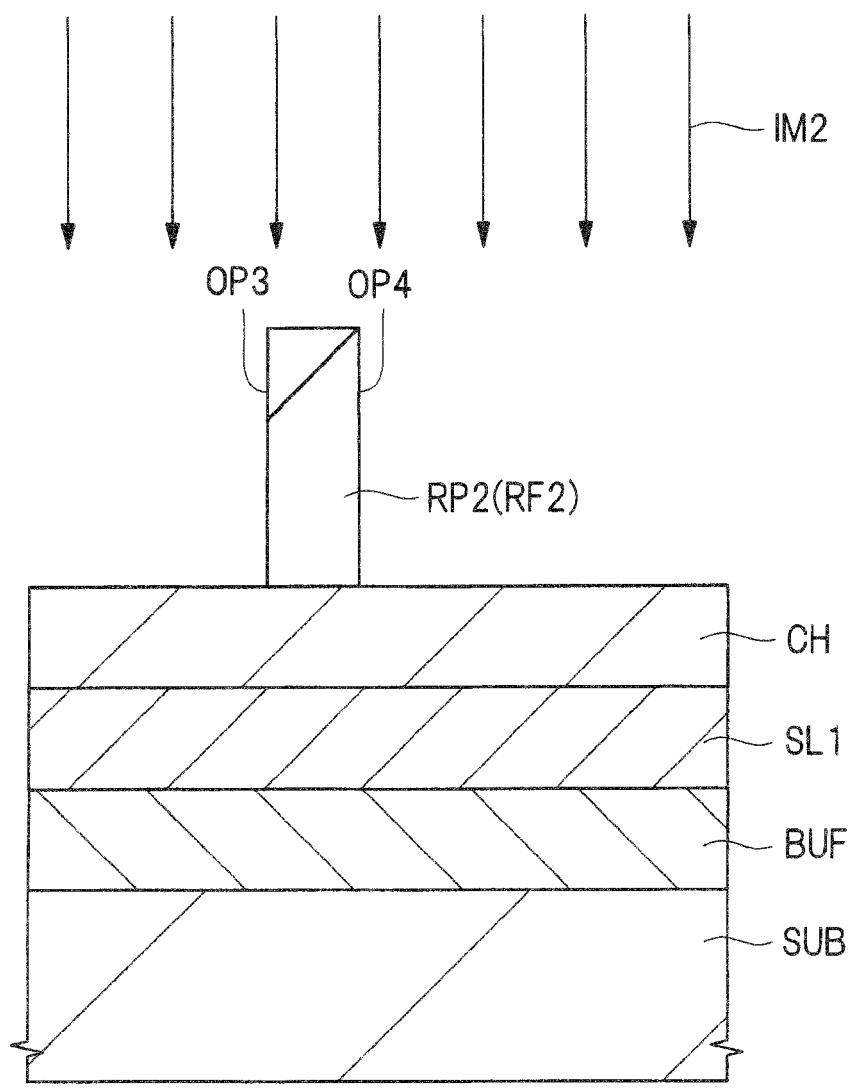
FIG. 23 is a major-part sectional diagram illustrating the manufacturing process of the semiconductor device of the fourth embodiment.

In the step of forming the semiconductor regions SR2 and DR2, the source region SR1, and the drain region DR1, first, as illustrated in FIG. 23, a photoresist is applied onto the channel layer CH to form a resist film RF2, and then the resist film RF2 is subjected to pattern exposure for development. This results in formation of openings OP3 and OP4 penetrating through the resist film RF2, leading to formation of a resist pattern RP2 configured of the resist film RF2 having the openings OP3 and OP4. The opening OP3 extends through the resist film RF2 up to the top of part of the channel layer CH, in which a semiconductor region 13 (see FIG. 24) is to be formed. The opening OP4 extends through the resist film RF2 up to the top of part of the channel layer CH, in which a semiconductor region 14 (see FIG. 24) is to be formed.

Figure 24:
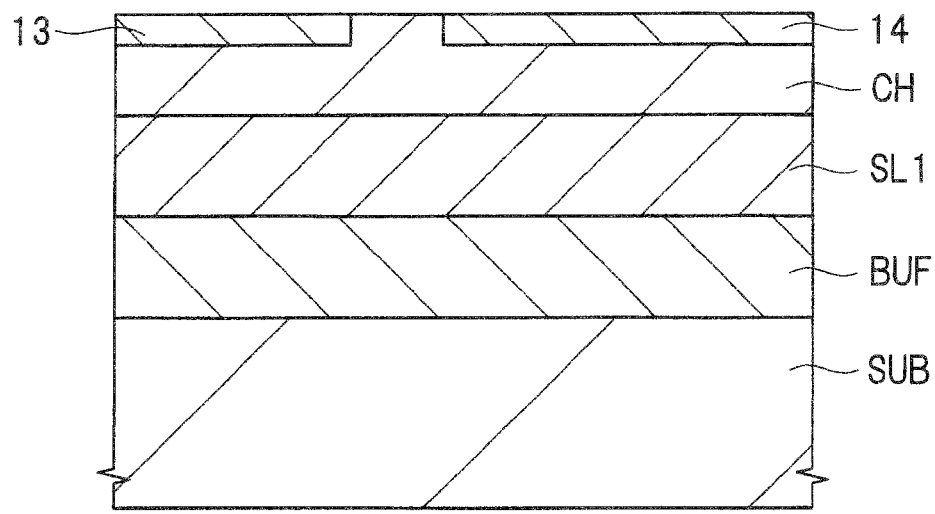
FIG. 24 is a major-part sectional diagram illustrating the manufacturing process of the semiconductor device of the fourth embodiment.

Subsequently, as illustrated in FIG. 23, ion implantation is performed with the resist pattern RP2 as a mask, thereby an n-type impurity IM2 such as silicon (Si) is implanted into part of the channel layer CH exposed on each of the bottoms of the openings OP3 and OP4 of the resist pattern RP2. Subsequently, the resist pattern RP2, i.e., the resist film RF2 is removed. Consequently, as illustrated in FIG. 24, the semiconductor region 13 containing the n-type impurity is formed in an upper portion of part of the channel layer CH corresponding to the source region SR1 and the semiconductor region SR2 (see FIG. 26) in a plan view. The semiconductor region 14 containing the n-type impurity is formed in an upper portion of part of the channel layer CH corresponding to the drain region DR1 and the semiconductor region DR2 (see FIG. 26) in a plan view.

Figure 25:
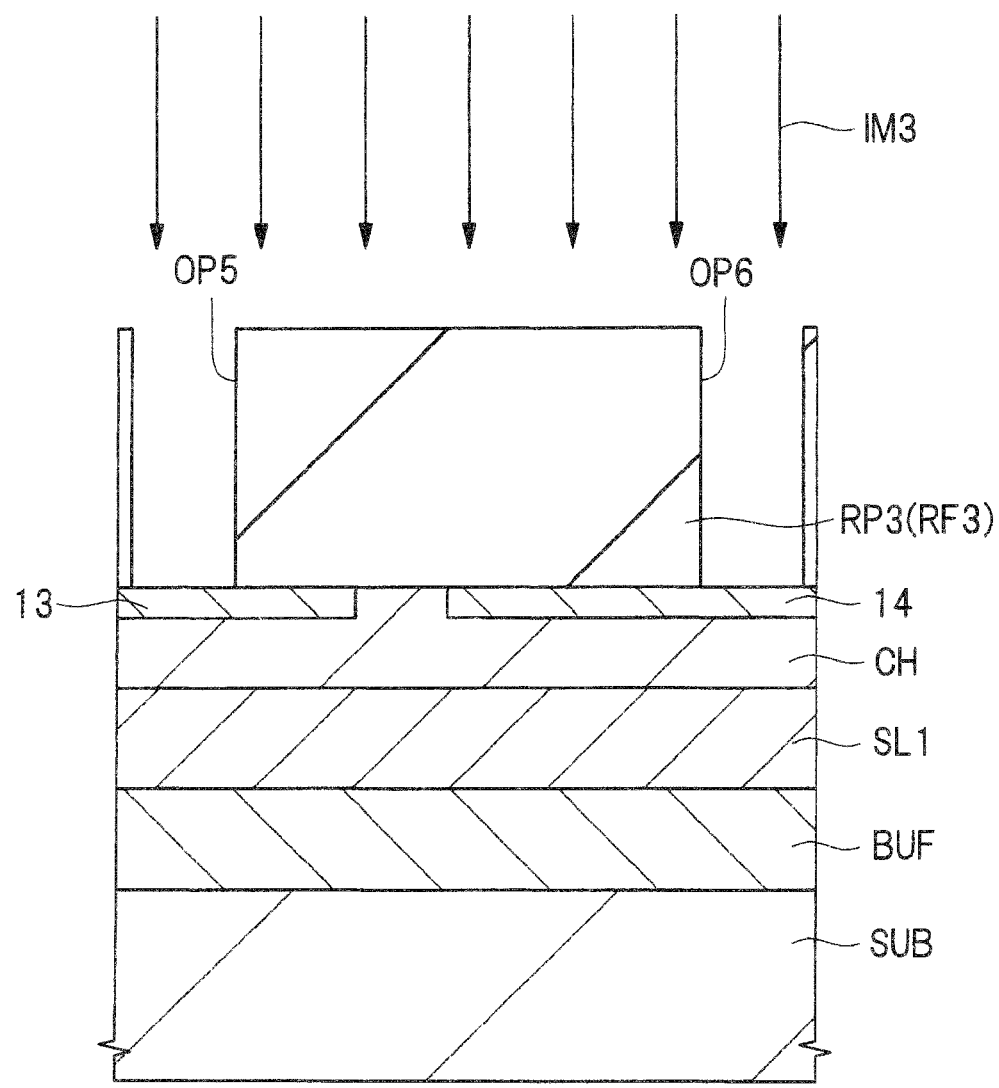
FIG. 25 is a major-part sectional diagram illustrating the manufacturing process of the semiconductor device of the fourth embodiment.
Figure 26:
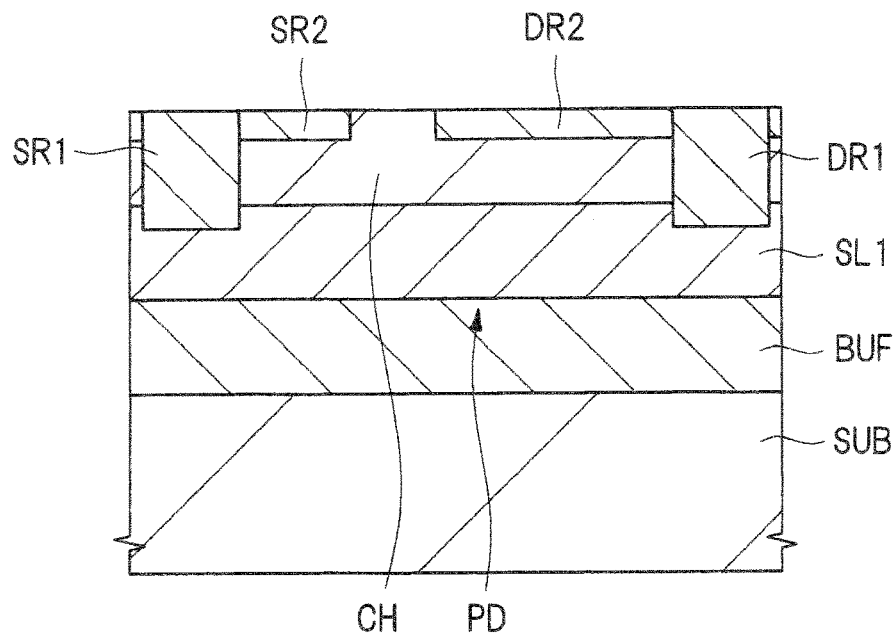
FIG. 26 is a major-part sectional diagram illustrating the manufacturing process of the semiconductor device of the fourth embodiment.

Subsequently, as illustrated in FIGS. 25 and 26, the source region SR1 and the drain region DR1 are formed.

In the step of forming the source region SR1 and the drain region DR1, first, as illustrated in FIG. 25, a photoresist is applied onto the semiconductor region 13, the semiconductor region 14, and the channel layer CH to form a resist film RF3, and then the resist film RF3 is subjected to pattern exposure for development. This results in formation of openings OP5 and OP6 penetrating through the resist film RF3, leading to formation of a resist pattern RP3 configured of the resist film RF3 having the openings OP5 and OP6. The opening OP5 extends through the resist film RF3 up to the top of part of the semiconductor region 13, in which the source region SR1 (see FIG. 26) is to be formed. The opening OP6 extends through the resist film RF3 up to the top of part of the semiconductor region 14, in which the drain region DR1 (see FIG. 26) is to be formed.

Subsequently, as illustrated in FIG. 25, ion implantation is performed with the resist pattern RP3 as a mask, thereby an n-type impurity IM3 such as silicon (Si) is implanted into part of the semiconductor region 13 exposed on the bottom of the opening OP5 of the resist pattern RP3 and part of the semiconductor region 14 exposed on the bottom of the opening OP6 of the resist pattern RP3. In this operation, ions are implanted while the implantation condition such as ion energy is appropriately adjusted, thereby the n-type impurity ions are implanted not only into part of the semiconductor region 13 exposed on the bottom of the opening OP5 but also into part of the channel layer CH corresponding to the opening OP5 in a plan view. In addition, the n-type impurity ions are implanted not only into part of the semiconductor region 14 exposed on the bottom of the opening OP6 but also into part of the channel layer CH corresponding to the opening OP6 in a plan view.

Subsequently, the resist pattern RP3, i.e., the resist film RF3 is removed, and the implanted n-type impurity is activated through heat treatment for about 20 min at about 850° C., for example. Consequently, as illustrated in FIG. 26, the n-type source region SR1 configured of a nitride semiconductor layer and the n-type drain region DR1 configured of a nitride semiconductor layer are formed in the channel layer CH separately from each other in a plan view. On the other hand, the n-type semiconductor region SR2 is formed in an upper portion of part of the channel layer CH adjacent to a side face SS1 (see FIG. 28 described later), which is close to the source region SR1, of the gate electrode GE in a plan view. Furthermore, the n-type semiconductor region DR2 is formed in an upper portion of part of the channel layer CH adjacent to a side face SS2 (see FIG. 28 described later), which is close to the drain region DR1, of the gate electrode GE in a plan view.

Figure 27:
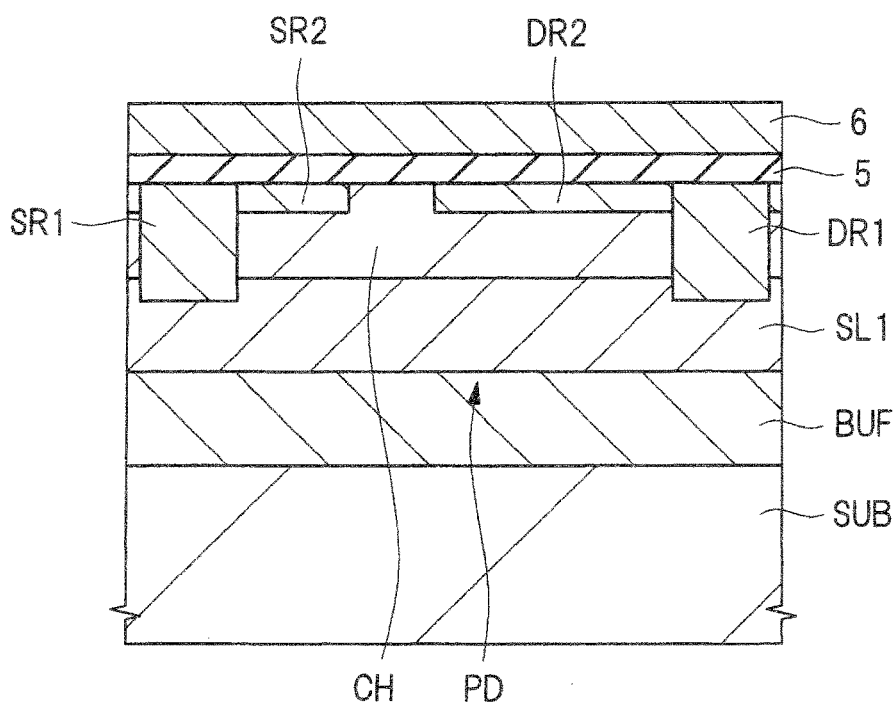
FIG. 27 is a major-part sectional diagram illustrating the manufacturing process of the semiconductor device of the fourth embodiment.
Figure 28:
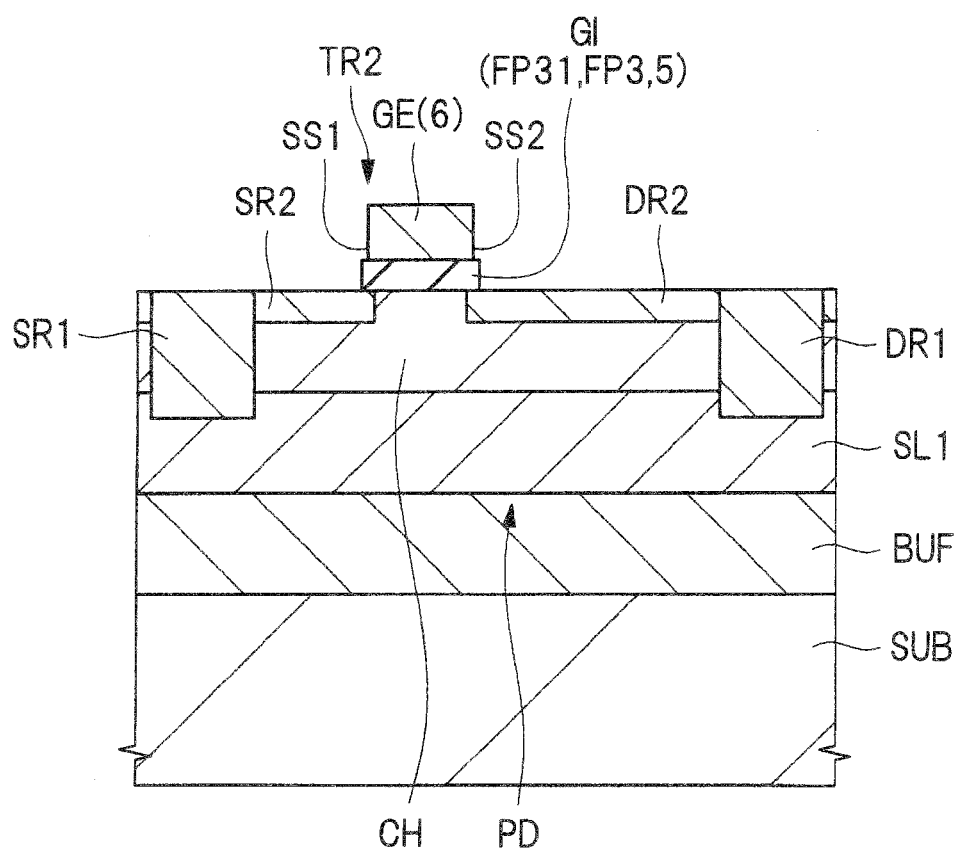
FIG. 28 is a major-part sectional diagram illustrating the manufacturing process of the semiconductor device of the fourth embodiment.

Subsequently, as illustrated in FIGS. 27 and 28, the gate insulating film GI and the gate electrode GE are formed.

First, through a process similar to the process described with reference to FIG. 9 in the first embodiment, as illustrated in FIG. 27, an insulating film 5 for the gate insulating film GI is formed over the source region SR1, the drain region DR1, the semiconductor region SR2, the semiconductor region DR2, and the channel layer CH, and a metal film 6 for the gate electrode GE is formed over the insulating film 5.

Subsequently, the metal film 6 and the insulating film 5 are patterned through a process similar to the process described with reference to FIG. 10 in the first embodiment. As illustrated in FIG. 28, this results in formation of the gate insulating film GI configured of part of the insulating film 5 left on part of the channel layer CH located between the source region SR1 and the drain region DR1, and formation of the gate electrode GE configured of part of the metal film 6 left on the gate insulating film GI. Consequently, the transistor TR2 is formed by the semiconductor layer SL1, the channel layer CH, the source region SR1, the drain region DR1, the semiconductor region SR2, the semiconductor region DR2, the gate insulating film GI, and the gate electrode GE.

As described above, the gate insulating film GI forms the film part FP3. The film part FP3 is configured of the gate insulating film GI as a film part FP31 composed of insulator, and is provided on part of the channel layer CH located between the source region SR1 and the drain region DR1 in a plan view. The gate electrode GE is provided on the channel layer CH with the film part FP3 in between.

Subsequently, the protective insulating film PIF is formed through a process similar to the process described with reference to FIG. 11 in the first embodiment, and the contact holes CNT1, CNT2, and CNT3 are formed through a process similar to the process described with reference to FIG. 12 in the first embodiment. Subsequently, as illustrated in FIG. 21, the source electrode SE, the drain electrode DE, and the gate electrode interconnection GW are formed through a process similar to the process described with reference to FIG. 1 in the first embodiment. This is the end of manufacturing of the transistor TR2 as illustrated in FIG. 21.

Main Characteristics and Effects of Fourth Embodiment

In the fourth embodiment, as with the first embodiment, the protection diode PD configured of the source region SR1, the semiconductor layer SL1, and the drain region DR1 is provided on the substrate SUB, and the transistor TR2 as a field effect transistor is provided on the protection diode PD. Consequently, the semiconductor device of the fourth embodiment exhibits effects similar to those of the semiconductor device of the first embodiment.

In the fourth embodiment, the field effect transistor is a MISFET, and the gate electrode GE is provided on the channel layer CH with the film part FP3 composed of insulator in between. When the field effect transistor is a MISFET, the electron supply layer ES configured of a nitride semiconductor layer including, for example, aluminum gallium nitride (AlGaN) is not necessary to be formed by epitaxial growth on the channel layer CH configured of the nitride semiconductor layer including, for example, gallium nitride (GaN). Hence, production cost of the semiconductor device is reduced.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A semiconductor device, comprising:
a semiconductor substrate composed of silicon;
a first nitride semiconductor layer of a first conductivity type provided over the semiconductor substrate;
a second nitride semiconductor layer provided over the first nitride semiconductor layer;
a first semiconductor region of a second conductivity type opposite to the first conductivity type, the first semiconductr region being provided in the second nitride semiconductor layer;
a second semiconductor region of the second conductivity type provided in the second nitride semiconductor layer separately from the first semiconductor region in plan view;
a first film part including of an insulator and a nitride semiconductor, and provided over part of the second nitride semiconductor layer located between the first semiconductor region and the second semiconductor region;
a gate electrode provided over the first film part;
a source electrode electrically coupled to the first semiconductor region; and
a drain electrode electrically coupled to the second semiconductor region,
wherein each of the first semiconductor region and the second semiconductor region is in contact with the first nitride semiconductor layer,
a first nitride semiconductor region is provided over part of the second nitride semiconductor layer located between the first semiconductor region and the first film part;
a second nitride semiconductor region is provided over part of the second nitride semiconductor layer located between the second semiconductor region and the first film part,
a bandgap of the first nitride semiconductor region and a bandgap of the second nitride semiconductor region are each wider than a bandgap of the second nitride semiconductor layer, and
the first film part includes a first insulting film provided over part of the second nitride semiconductor layer located between the first nitride semiconductor region and the second nitride semiconductor region,
said semiconductor device further comprising a third nitride semiconductor layer provided over the semiconductor substrate, and exhibiting spontaneous polarization,
wherein the first nitride semiconductor layer is provided over the third nitride semiconductor layer,
wherein the second nitride semiconductor layer exhibits spontaneous polarization, and
wherein the amount of spontaneous polarization of the third nitride semiconductor layer is larger than the amount of spontaneous polarization of the second nitride semiconductor layer.

2. The semiconductor device according to claim 1,
wherein the first film part includes a third nitride semiconductor region provided over part of the second nitride semiconductor layer located between the first nitride semiconductor region and the second nitride semiconductor region, and
wherein the first nitride semiconductor region, the third nitride semiconductor region, and the second nitride semiconductor region are integrally provided.

3. The semiconductor device according to claim 2,
wherein a first insulating film is provided over the third nitride semiconductor region.

4. The semiconductor device according to claim 3,
wherein a bandgap of the first insulating film is wider than a bandgap of the third nitride semiconductor region.

5. The semiconductor device according to claim 1,
wherein the third nitride semiconductor layer contains an impurity of the first conductivity type introduced therein.

6. The semiconductor device according to claim 1,
wherein each of the first semiconductor region and the second semiconductor region extends to the inside of the first nitride semiconductor layer through the second nitride semiconductor layer.

7. The semiconductor device according to claim 1, further comprising a fourth nitride semiconductor layer formed by epitaxial growth over the semiconductor substrate,
wherein the first nitride semiconductor layer is formed by epitaxial growth over the semiconductor substrate with the fourth nitride semiconductor layer in between.

8. The semiconductor device according to claim 1,
wherein the second nitride semiconductor layer is an intrinsic layer.

9. The semiconductor device according to claim 1,
wherein the first nitride semiconductor layer is composed of gallium nitride,
wherein the second nitride semiconductor layer is composed of gallium nitride, and wherein the first nitride semiconductor region and the second nitride semiconductor region are each composed of aluminum gallium nitride.

10. A semiconductor device, comprising:

a semiconductor substrate composed of silicon;

a first nitride semiconductor layer of a first conductivity type provided over the semiconductor substrate;

a second nitride semiconductor layer provided over the first nitride semiconductor layer;

a first semiconductor region of a second conductivity type opposite to the first conductivity type, the first semiconductor region being provided in the second nitride semiconductor layer;

a second semiconductor region of the second conductivity type provided in the second nitride semiconductor layer separately from the first semiconductor region in a plan view;

a first film part including one of an insulator and a nitride semiconductor, and provided over part of the second nitride semiconductor layer located between the first semiconductor region and the second semiconductor region;

a gate electrode provided over the first film part;

a source electrode electrically coupled to the first semiconductor region; and a drain electrode electrically coupled to the second semiconductor region, wherein each of the first semiconductor region and the second semiconductor region is in contact with the first nitride semiconductor layer, said semiconductor device further comprising:

a third semiconductor region of the second conductivity type provided in an upper portion of part of the second nitride semiconductor layer adjacent to a first side face of the gate electrode in a plan view, the first side face being close to the first semiconductor region, and a fourth semiconductor region of the second conductivity type provided in an upper portion of part of the second nitride semiconductor layer adjacent to a second side face of the gate electrode in a plan view, the second side face being close to the second semiconductor region, wherein the first film part includes a third insulating film provided over the second nitride semiconductor layer, wherein the third semiconductor region is in contact with the first semiconductor region, wherein the fourth semiconductor region is in contact with the second semiconductor region, wherein concentration of the impurity of the second conductivity type in the third semiconductor region is lower than concentration of the impurity of the second conductivity type in the first semiconductor region, and wherein concentration of the impurity of the second conductivity type in the fourth semiconductor region is lower than concentration of the impurity of the second conductivity type in the second semiconductor region.

* * * * *